(12) United States Patent
Sakamoto et al.

(10) Patent No.: US 10,379,291 B2
(45) Date of Patent: Aug. 13, 2019

(54) LIGHT GUIDE DEVICE, MANUFACTURING METHOD, AND LASER DIODE MODULE

(71) Applicant: FUJIKURA LTD., Tokyo (JP)

(72) Inventors: Shinichi Sakamoto, Sakura (JP); Shohei Kumeta, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 292 days.

(21) Appl. No.: 15/154,401

(22) Filed: May 13, 2016

(65) Prior Publication Data

US 2016/0252679 A1    Sep. 1, 2016

Related U.S. Application Data

(63) Continuation of application No. PCT/JP2014/077505, filed on Oct. 16, 2014.

(30) Foreign Application Priority Data

Nov. 15, 2013   (JP) .................................. 2013-237400

(51) Int. Cl.
*G02B 6/28*        (2006.01)
*G02B 5/04*        (2006.01)
(Continued)

(52) U.S. Cl.
CPC ............. *G02B 6/2817* (2013.01); *G02B 5/04* (2013.01); *G02B 6/2848* (2013.01);
(Continued)

(58) Field of Classification Search
CPC ........ G02B 27/106; G02B 27/12; G02B 5/04; G02B 6/2817; G02B 6/2848;
(Continued)

(56) References Cited

U.S. PATENT DOCUMENTS 2,964,996 A * 12/1960 Klemann ............... G02B 21/00
                                                              353/39
3,966,328 A *  6/1976 Wiklund .............. G01C 15/004
                                                              356/138
(Continued)

FOREIGN PATENT DOCUMENTS

CN          1521963 A  *  8/2004 ......... G02B 27/0905
JP       61-212819 A       9/1986
(Continued)

OTHER PUBLICATIONS

P. R. Yoder, "High Precision 10-cm Aperture Penta and Roof-Penta Mirror Assemblies," Appl. Opt. 10, 2231-2234 (1971) (Year: 1971).*
(Continued)

*Primary Examiner* — Peter Radkowski
(74) *Attorney, Agent, or Firm* — Westerman, Hattori, Daniels & Adrian, LLP

(57) ABSTRACT

A double mirror (Mi) is made of a first mirror (Mi1) that is mounted on a top surface of a base plate (B) and a second mirror (Mi2) that is mounted on a top surface of the first mirror (Mi1). The first mirror (Mi1) has a reflective surface (S1) for reflecting an input beam. The second mirror (Mi2) has a reflective surface (S2) for reflecting the input beam which has been reflected by the reflective surface (S1).

9 Claims, 16 Drawing Sheets

(51) Int. Cl.
  *G02B 27/10* (2006.01)
  *G02B 27/12* (2006.01)
  *H01S 5/00* (2006.01)
  *H01S 5/40* (2006.01)
  *G02B 6/42* (2006.01)
  *H01S 5/022* (2006.01)

(52) U.S. Cl.
  CPC ......... *G02B 6/4214* (2013.01); *G02B 6/4249* (2013.01); *G02B 27/106* (2013.01); *G02B 27/12* (2013.01); *H01S 5/0071* (2013.01); *H01S 5/4012* (2013.01); *H01S 5/005* (2013.01); *H01S 5/02248* (2013.01)

(58) Field of Classification Search
  CPC ..... G02B 6/4214; G02B 6/4249; H01S 5/005; H01S 5/0071; H01S 5/02248; H01S 5/4012
  See application file for complete search history.

(56) References Cited

U.S. PATENT DOCUMENTS

| | | | | |
|---|---|---|---|---|
| 4,601,550 A * | 7/1986 | Yoshino | G02B 21/22 | 359/377 |
| 4,634,241 A * | 1/1987 | Kohayakawa | G02B 21/22 | 359/377 |
| 4,702,570 A * | 10/1987 | Yoshino | G02B 21/22 | 359/377 |
| 5,072,313 A * | 12/1991 | Schweitzer | G02B 5/04 | 359/529 |
| 5,191,485 A * | 3/1993 | Kahle | G02B 5/04 | 355/45 |
| 5,223,970 A * | 6/1993 | Oono | G02B 26/0816 | 359/196.1 |
| 5,400,143 A * | 3/1995 | Bauer | G01B 9/02021 | 356/485 |
| 5,513,201 A * | 4/1996 | Yamaguchi | G02B 6/425 | 372/70 |
| 5,808,323 A * | 9/1998 | Spaeth | G02B 27/1086 | 257/88 |
| 6,137,930 A * | 10/2000 | Laughlin | G02B 6/266 | 385/31 |
| 6,253,007 B1 * | 6/2001 | Laughlin | G02B 6/266 | 385/33 |
| 6,473,250 B1 * | 10/2002 | Chapman | G02B 26/0883 | 359/669 |
| 6,504,650 B1 * | 1/2003 | Alfrey | G02B 27/09 | 359/618 |
| 6,765,544 B1 * | 7/2004 | Wynne Willson | H04N 9/3141 | 345/6 |
| 6,814,454 B2 * | 11/2004 | Aziz | G02B 26/0816 | 359/857 |
| 6,970,294 B2 * | 11/2005 | Nishimura | B23K 26/067 | 359/618 |
| 6,993,059 B2 * | 1/2006 | Anikitchev | G02B 27/0977 | 372/100 |
| 7,058,255 B1 * | 6/2006 | Fang | G02B 6/3524 | 385/16 |
| 7,181,102 B1 * | 2/2007 | Fang | G02B 6/3514 | 385/15 |
| 7,256,934 B2 * | 8/2007 | Bihr | G02B 17/045 | 359/384 |
| 7,742,172 B2 * | 6/2010 | Cluff | G02B 26/06 | 356/455 |
| 7,817,693 B2 * | 10/2010 | Alahautala | B23K 26/0604 | 372/50.12 |
| 7,830,608 B2 * | 11/2010 | Hu | G02B 27/0944 | 359/618 |
| 2002/0172133 A1 * | 11/2002 | Kim | G02B 5/04 | 369/112.19 |
| 2002/0191191 A1 * | 12/2002 | Bockman | G01J 9/02 | 356/493 |
| 2004/0070820 A1 * | 4/2004 | Nishimura | B23K 26/067 | 359/359 |
| 2004/0080842 A1 * | 4/2004 | Aziz | G02B 17/02 | 359/857 |
| 2004/0252388 A1 * | 12/2004 | Yamanaka | G02B 27/0905 | 359/834 |
| 2004/0252744 A1 * | 12/2004 | Anikitchev | G02B 27/0977 | 372/100 |
| 2004/0263958 A1 * | 12/2004 | Bihr | G02B 17/045 | 359/382 |
| 2006/0098700 A1 * | 5/2006 | Alahautala | B23K 26/0604 | 372/29.014 |
| 2006/0146334 A1 * | 7/2006 | Cluff | G01N 21/3581 | 356/455 |
| 2007/0024976 A1 * | 2/2007 | Schluchter | G02B 5/305 | 359/489.17 |
| 2007/0268571 A1 * | 11/2007 | Hu | G02B 27/0944 | 359/349 |
| 2011/0216417 A1 * | 9/2011 | Chann | G02B 27/0905 | 359/618 |
| 2013/0258469 A1 * | 10/2013 | Park | G02B 27/283 | 359/485.01 |

FOREIGN PATENT DOCUMENTS

| | | | | |
|---|---|---|---|---|
| JP | 61212819 A | * | 9/1986 | |
| JP | 63-113509 A | | 5/1988 | |
| JP | 63113509 A | * | 5/1988 | |
| JP | 05015009 A | * | 1/1993 | |
| JP | 5-15009 U | | 2/1993 | |
| JP | 2002-169480 A | | 6/2002 | |
| JP | 2002169480 A | * | 6/2002 | ....... G02F 1/133615 |
| JP | 2004-145136 A | | 5/2004 | |
| JP | 2004145136 A | * | 5/2004 | |
| JP | 2004-252428 A | | 9/2004 | |
| JP | 2004252428 A | * | 9/2004 | ........ G02B 27/0905 |
| JP | 2010-91658 A | | 4/2010 | |
| JP | 2010091658 A | * | 4/2010 | |
| JP | 2011167704 A | * | 9/2011 | |
| WO | 2011/109763 A2 | | 9/2011 | |
| WO | WO 2011109763 A2 | * | 9/2011 | ........ G02B 27/0905 |

OTHER PUBLICATIONS

Sanjib Chatterjee and Y. Pavan Kumar, "Simple technique for the fabrication of a penta prism with high accuracy right angle deviation," Appl. Opt. 46, 6520-6525 (2007) (Year: 2007).*
A. S. DeVany, "Reduplication of a Penta Prism Angle Using Master Angle Prisms and a Plano-Interferometer," (Year: 1971).*
Edmund Optics, Perpendicular Figure-4 Configuration, 2018, available at https://www.edmundoptics.com/resources/application-notes/lasers/simplifying-laser-alignment/ (Year: 2018).*
Physics Exchange, Collinear Alignment of Laser Beams Using Translation Stages, 2014, available at https://physics.stackexchange.com/questions/139756/collinearity—(Year: 2014).*
Office Action dated Mar. 24, 2017, issued in counterpart Chinese Application No. 201480062468.1, with English tanslation. (10 pages).
Extended (supplementary) European Search Report dated Nov. 28, 2016, issued in counterpart European Application No. 14861325.0. (5 pages).
Office Action dated Nov. 1, 2016, issued in counterpart Chinese Patent Application No. 201480062468.1. (9 pages).
Office Action dated Nov. 11, 2014, issued in counterpart of JP 2013-237400 (2 pages).
Decision of Refusal dated Jan. 27, 2015, issed in counterpart of JP2013-237400 (3 pages).
Allowance dated Jun. 9, 2015, issued in counterpart of JP 2013-237400 (1 page).
International Search Report dated Dec. 22, 2014, issued in counterpart of International Application No. PCT/JP2014/077505 (1 page).

* cited by examiner

FIG. 10
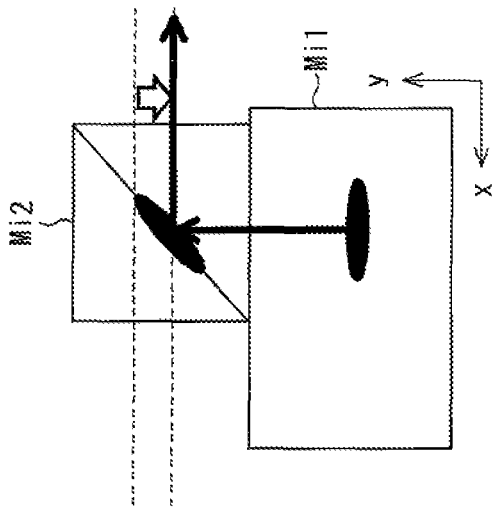
(a)
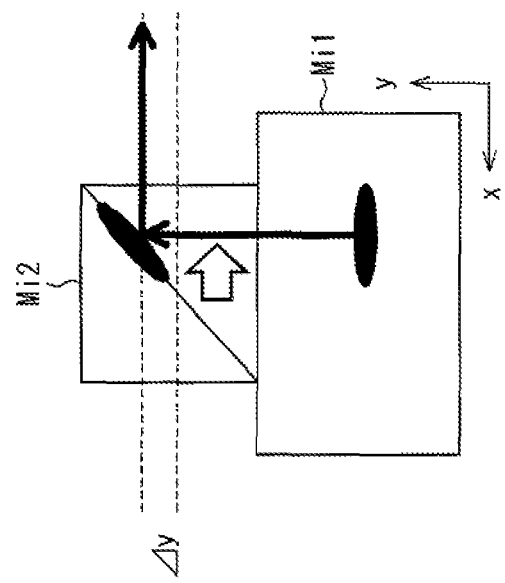
(b)

LIGHT GUIDE DEVICE, MANUFACTURING METHOD, AND LASER DIODE MODULE

CROSS-REFERENCE TO RELATED APPLICATIONS

This application is a Continuation of PCT International Application No. PCT/JP2014/077505 filed in Japan on Oct. 16, 2014, which claims the benefit of Patent Application No. 2013-237400 filed in Japan on Nov. 15, 2013, the entire contents of which are hereby incorporated by reference.

TECHNICAL FIELD

The present invention relates to a light-guiding device that converts an input beam bundle made of a plurality of input beams to an output beam bundle made of a plurality of output beams. The present invention also relates to a method of producing such a light-guiding device and to an LD module including such a light-guiding device.

BACKGROUND ART

LD modules are widely used for the purpose of coupling a laser beam emitted from an LD (Laser Diode) element (semiconductor laser element) to an optical fiber. Among such LD modules, a micro-optical device disclosed in Patent Literature 1 has been known as a light-guiding device that guides a laser beam emitted from each of a plurality of LED elements to an optical fiber.

FIG. 16 is a perspective view of a micro-optical device 10 disclosed in Patent Literature 1. As illustrated in FIG. 16, the micro-optical device 10 includes a base plate 11, an LD bar 12, a cylindrical lens 13, a first mirror row 14, and a second mirror row 15.

The LD bar 12 includes a plurality of LD elements aligned along an x axis and emits laser beams in a z-axis positive direction from the plurality of LD elements, respectively. The laser beams emitted in the z-axis positive direction from the plurality of LD elements, respectively, have respective optical axes that are aligned along the x axis within a first plane parallel to a zx plane.

Note that propagation directions of the laser beams emitted from the LD elements, respectively, are dispersed in directions in a range of $\pm\theta x$ around the z-axis positive direction at the center. On this account, the micro-optical device 10 is arranged such that the laser beams emitted from the LD elements, respectively, are collimated by the cylindrical lens 13 that is provided so as to face an emission edge surface of the LD bar 12 (i.e., the propagation directions are converged in the z-axis positive direction).

The first mirror row 14 is a mirror row in which mirror surfaces 14a are combined. The mirror surfaces 14a are opposed to the LD elements, respectively, which constitute the LD bar 12. Each of the laser beams emitted from the LD elements in the z-axis positive direction, respectively, is reflected into a y-axis positive direction by a corresponding mirror surface 14a which is opposed to a corresponding one of the LD element. Meanwhile, the second mirror row 15 is a mirror row in which mirror surfaces 15a are combined. The mirror surfaces 15a are opposed to the mirror surfaces 14a, respectively, which constitute the first mirror row 14. Each of the laser beams having been reflected into the y-axis positive direction by the mirror surfaces 14a, respectively, is further reflected into an x-axis positive direction by a corresponding mirror surface 15a which is opposed to one of the mirror surface 14a that has reflected the laser beam.

Note that, mirror surfaces 14a and 15a that reflect a laser beam emitted from an (i+1)th LD element (as counted in a direction from an x-axis positive side to an x-axis negative side) are provided on a z-axis negative direction side of mirror surfaces 14a and 15b that reflect a laser beam emitted from an i-th LD element (as counted in the direction from the x-axis positive side to the x-axis negative side). On this account, optical axes of the laser beams reflected by the mirror surfaces 15a are aligned along a z axis in a second plane that is parallel to the zx plane. This second plain is at a position on a y-axis positive direction side of the first plane as described above.

In this way, the micro-optical device 10 functions to convert a first beam bundle made of laser beams propagating in the z-axis positive direction in which the laser beams are emitted from the LD elements constituting the LD bar 12, to a second beam bundle made of laser beams propagating in an x-axis direction into which the laser beams are reflected by the mirror surfaces 15a constituting the second mirror row 15. The second beam bundle that is to be outputted from the micro-optical device 10 (hereinafter, referred to as "output beam bundle") is converged on an incident edge surface of an optical fiber by, for example, a lens (not illustrated).

CITATION LIST

Patent Literature

Patent Literature 1
Japanese Patent Application Publication, Tokukai, No. 2004-252428 (Publication Date: Sep. 9, 2004)

SUMMARY OF INVENTION

Technical Problem

However, in the conventional micro-optical device 10, it is inevitable that propagation directions of laser beams constituting an output beam bundle vary in a case where propagation directions of laser beams emitted from respective LD elements vary (the propagation directions are unevenly inclined). This is because the propagation directions of the laser beams constituting the output beam bundle cannot be individually adjusted due to a configuration in which the mirror surfaces 14a for reflecting the laser beams emitted from the LD elements are combined as the mirror row 14 and the mirror surfaces 15a for further reflecting the laser beams are combined as the mirror row 15. Variation of the propagation directions of the laser beams constituting the output beam bundle makes it difficult to converge the output beam bundle on an incident edge surface of an optical fiber, and consequently becomes a factor that hinders realization of a higher output and a higher efficiency.

This problem is particularly prominent in a multi-chip LD module. The multi-chip LD module indicates an LD module that has, as a light source, a plurality of LD chips each including one LD element. It is apparent that, in such a multi-chip LD module that requires mounting each LD chip individually, variation of propagation directions of laser beams emitted from respective LD chips easily occurs.

Note that in a case where inclinations of the propagation directions of the laser beams emitted from the LD elements, respectively, are uniform, it is possible to make laser beams constituting the output beam bundle to propagate in a predetermined direction by adjusting an inclination of the mirror row 14. However, it is difficult to maintain such an inclination of the mirror row 14, for the following reason.

That is, it is difficult to maintain the inclination because a thickness of an adhesive layer interposed between the mirror row 14 and the base plate 11 needs to be made non-uniform in a case where the mirror row 14 in an inclined state is adhered to the base plate 11. Accordingly, when the adhesive layer is cured, non-uniform cure shrinkage occurs. This consequently changes the inclination of the mirror row 14. Further, even after the adhesive layer is cured, non-uniform thermal expansion/thermal shrinkage occurs in accordance with a temperature increase/temperature decrease. This consequently changes the inclination of the mirror row 14.

The present invention is attained in view of the above problems. An object of the present invention is to provide (i) a light-guiding device that converts an input beam bundle made of a plurality of input beams to an output beam bundle made of a plurality of output beams, which light-guiding device is capable of adjusting propagation directions of the output beams into a predetermined direction even in a case where propagation directions of the input beams are inclined non-uniformly or uniformly, and also (ii) an LD module capable of realizing a higher output and a higher efficiency by use of the light-guiding device.

Solution to Problem

A light-guiding device of the present invention is a light-guiding device that converts an input beam bundle made of a plurality of input beams to an output beam bundle made of a plurality of output beams, including: double mirrors which (i) correspond to the respective input beams and (ii) are separated from each other, each of the double mirrors being made of a first mirror that is mounted on a certain flat surface and a second mirror that is mounted on the first mirror, the first mirror having a first reflective surface which (i) reflects a corresponding one of the input beams and (ii) is arranged so that there is an angle of $\theta 1$ between the certain flat surface and the first reflective surface, the second mirror having a second reflective surface which (i) reflects the corresponding one of the input beams which has been reflected by the first reflective surface and (ii) is arranged so that there is an angle of $\theta 2$ between the certain flat surface and the second reflective surface, the $\theta 1$ satisfying the following expression: $(90°-\theta_{angle})=-\theta 2y=-(90°-\varphi 1)\times 2-(90°-\theta 1\times 2)$, and the $\theta 2$ satisfying the following expression: $(90°-\varphi 2)=-\theta 1y\times 2-(90°-\theta 2\times 2)$, where (i) $\theta_{angle}$ is an angle between the corresponding one of the input beams and a corresponding one of the output beams, (ii) $\varphi 1$ is an angle between an optical axis of the corresponding one of the input beams and a normal of the certain flat surface, (iii) $\varphi 2$ is an angle between an optical axis of the corresponding one of the output beams and the normal of the certain flat surface, (iv) $\theta 1y$ is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the input beams onto the certain flat surface, and (v) $\theta 2y$ is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the input beams onto the certain flat surface.

An LD module including: a plurality of LD elements; and a light-guiding device that converts an input beam bundle made of a plurality of laser beams that have respectively been emitted from the plurality of LD elements, to an output beam bundle made of a plurality of output beams, the light guiding device including double mirrors which (i) correspond to the respective LD elements and (ii) are separated from each other, each of the double mirrors being made of a first mirror that is mounted on a certain flat surface and a second mirror that is mounted on the first mirror, the first mirror having a first reflective surface which (i) reflects a corresponding one of the laser beams which has been emitted from a corresponding one of the LD elements and (ii) is arranged so that there is an angle of $\theta 1$ between the certain flat surface and the first reflective surface, the second mirror having a second reflective surface which (i) reflects the corresponding one of the laser beams which has been reflected by the first reflective surface and (ii) is arranged so that there is an angle of $\theta 2$ between the certain flat surface and the second reflective surface, the $\theta 1$ satisfying the following expression: $(90°-\theta_{angle})=-\theta 2y=-(90°-\varphi 1)\times 2-(90°-\theta 1\times 2)$, and the $\theta 2$ satisfying the following expression: $(90°-\varphi 2)=-\theta 1y\times 2-(90°-\theta 2\times 2)$, where (i) $\theta_{angle}$ is an angle between the corresponding one of the laser beams and a corresponding one of the output beams, (ii) $\varphi 1$ is an angle between an optical axis of the corresponding one of the laser beams and a normal of the certain flat surface, (iii) $\varphi 2$ is an angle between an optical axis of the corresponding one of the output beams and the normal of the certain flat surface, (iv) $\theta 1y$ is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the laser beams onto the certain flat surface, and (v) $\theta 2y$ is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the laser beams onto the certain flat surface.

Advantageous Effects of Invention

The present invention makes it possible to provide (i) a light-guiding device capable of adjusting propagation directions of output beams into a predetermined direction even in a case where propagation directions of the input beams are inclined non-uniformly or uniformly, and also (ii) an LD module capable of realizing a higher output and a higher efficiency by use of the light-guiding device.

Figure 6:
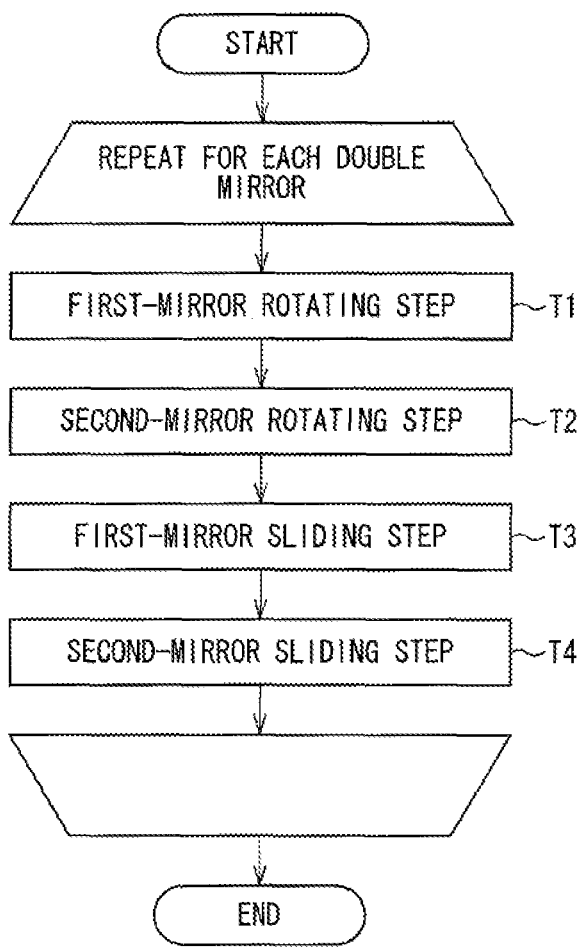
FIG. 6 is a flow chart illustrating a method of adjusting orientations and positions of the first mirror and the second mirror provided in the double mirror illustrated in FIG. 3.
Figure 7:
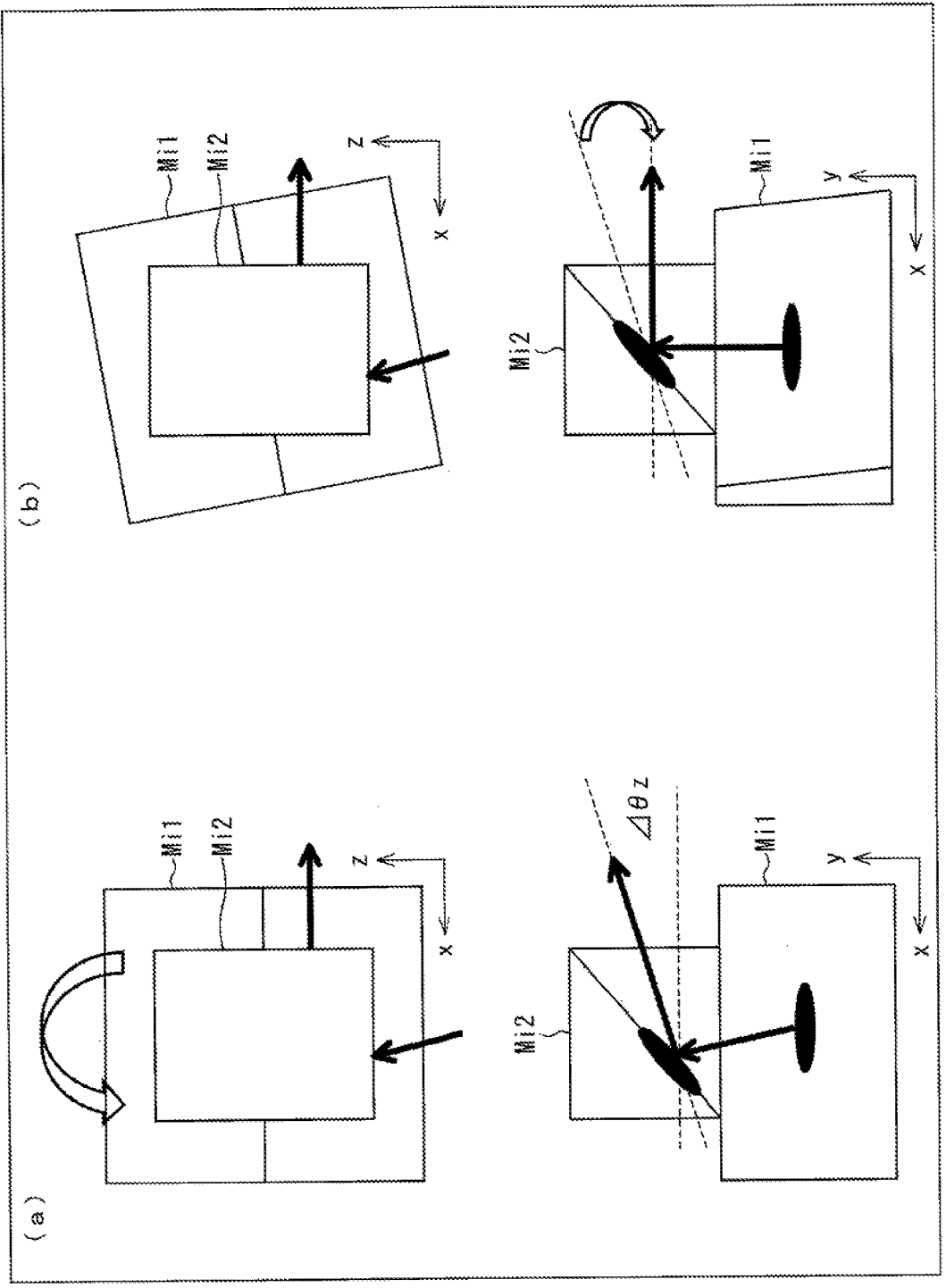

(a) of FIG. 7 is a top view (upper part) and a front view (lower part) each illustrating, as an example, a state of the double mirror prior to a first-mirror rotating step in the flow chart of FIG. 6. (b) of FIG. 7 is a top view (upper part) and a front view (lower part) each illustrating, as an example, a state of the double mirror after the first-mirror rotating step.

Figure 8:
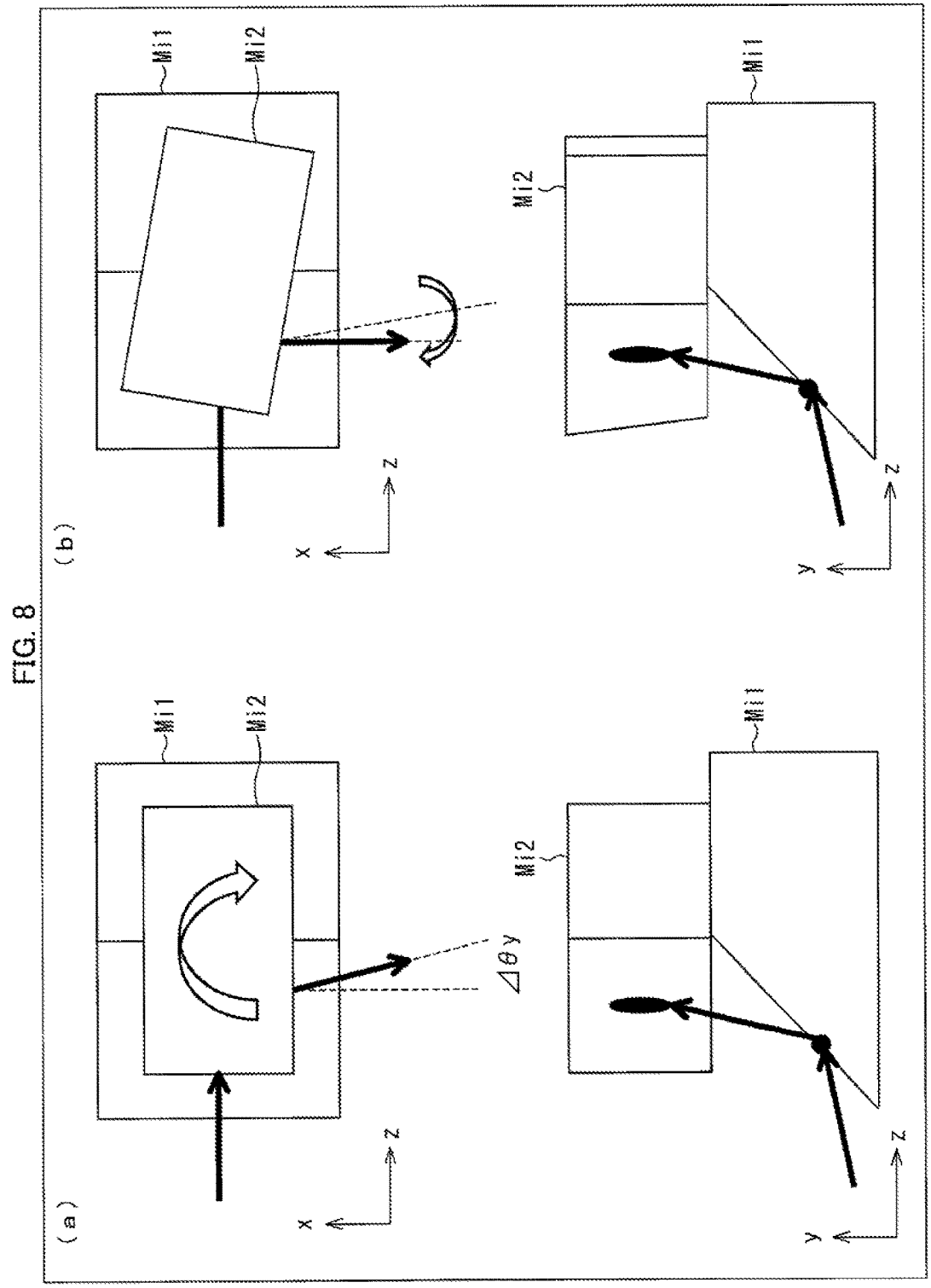

(a) of FIG. 8 is a top view (upper part) and a side view (lower part) each illustrating, as an example, a state of the double mirror prior to a second-mirror rotating step in the flow chart of FIG. 6. (b) of FIG. 8 is a top view (upper part) and a side view (lower part) each illustrating, as an example, a state of the double mirror after the second-mirror rotating step.

Figure 9:
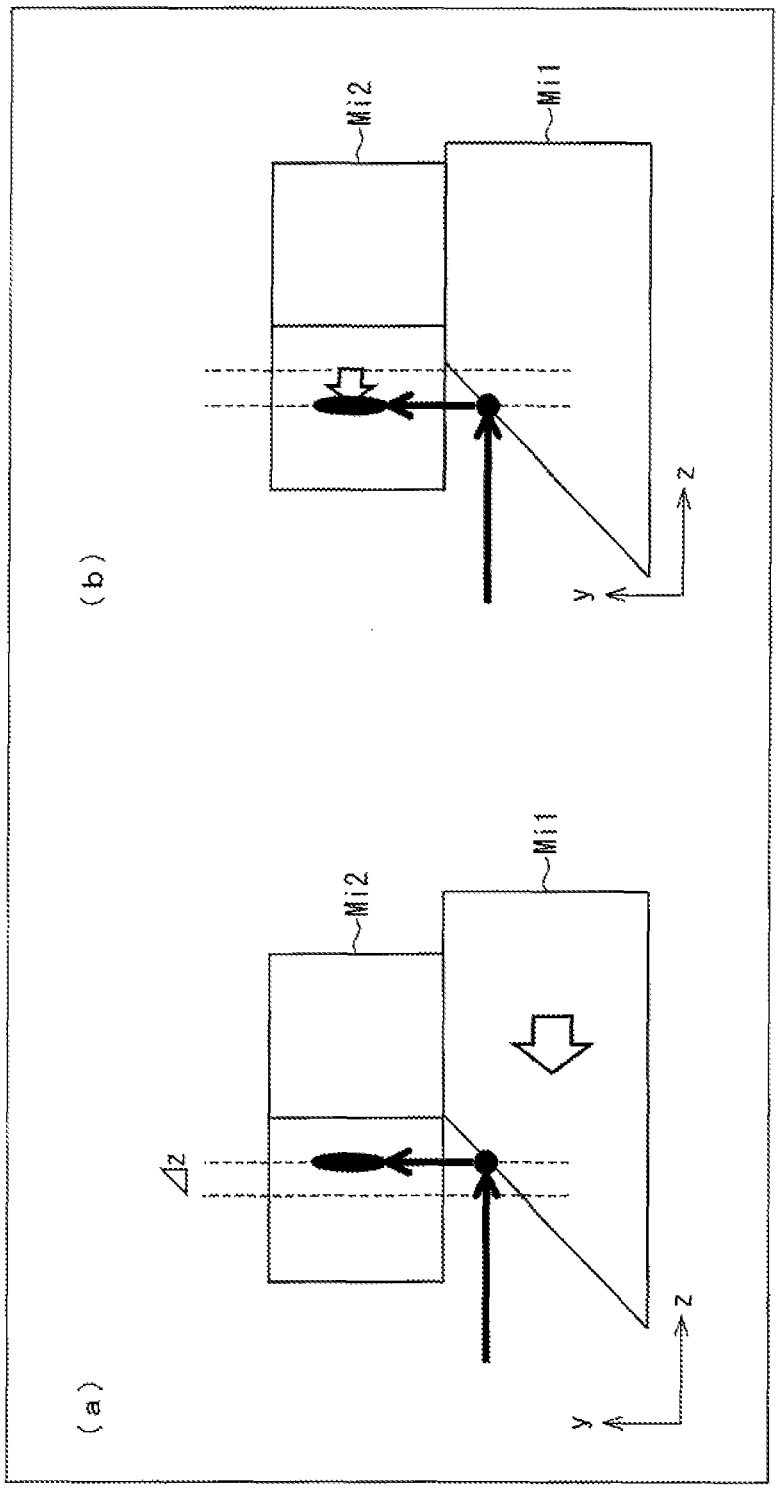

(a) of FIG. 9 is a side view illustrating, as an example, a state of the double mirror prior to a first-mirror sliding step in the flow chart shown in FIG. 6. (b) of FIG. 9 is a side view illustrating, as an example, a state of the double mirror after the first-mirror sliding step.

(a) of FIG. 10 is a front view illustrating, as an example, a state of the double mirror prior to a second-mirror sliding step in the flow chart shown in FIG. 6. (b) of FIG. 10 is a front view illustrating, as an example, a state of the double mirror after the second-mirror sliding step.

Figure 11:
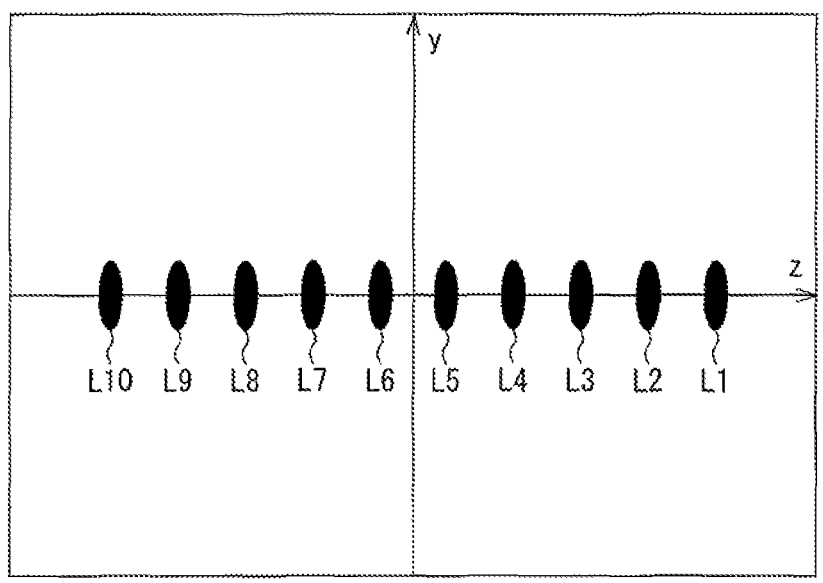

FIG. 11 is a view illustrating positions of output beams that serve as adjustment targets at the time when the adjustment method shown in FIG. 6 is carried out.

Figure 1:
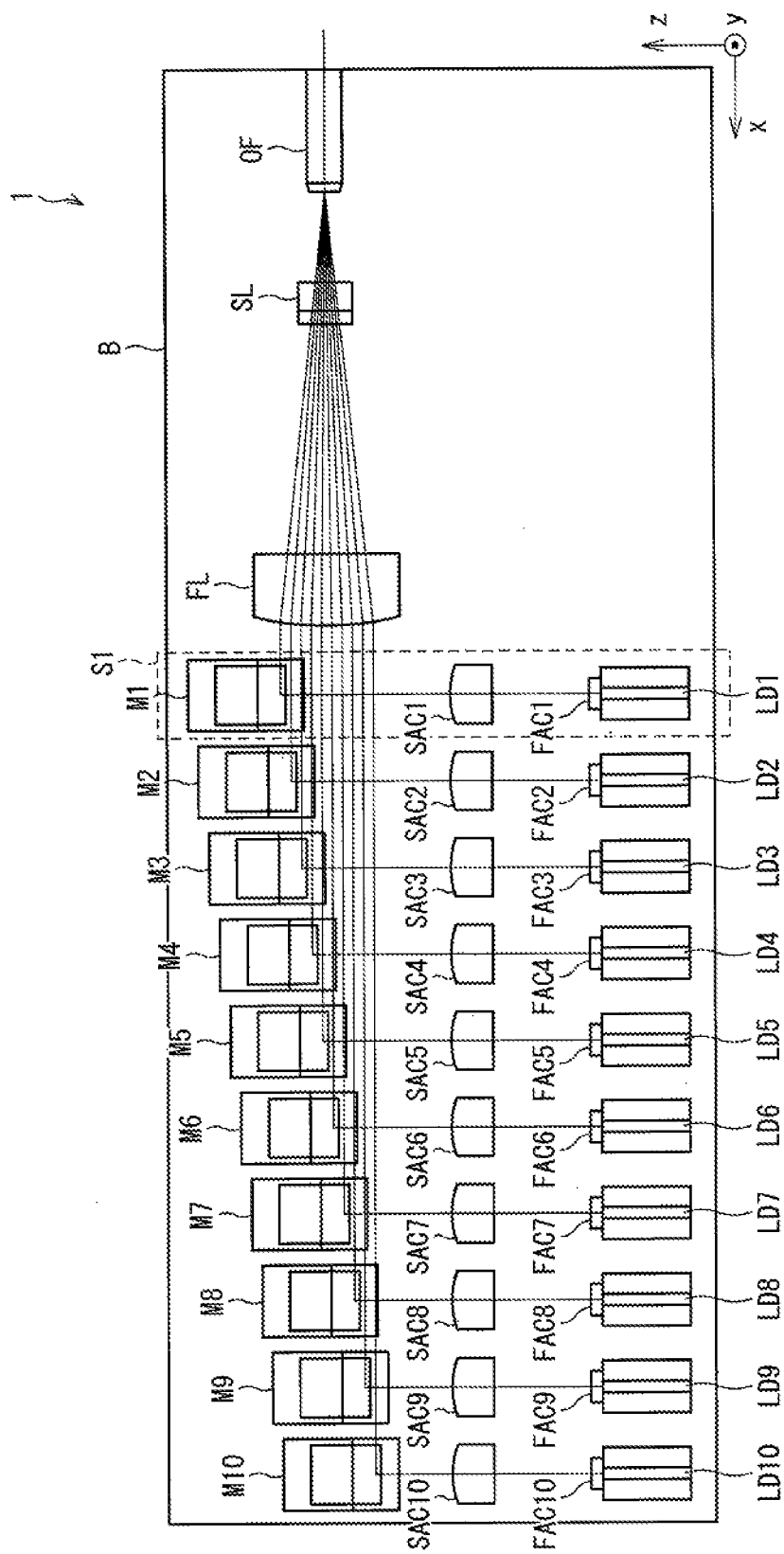
FIG. 1 is a top view illustrating a configuration of an LD module according to one embodiment of the present invention.
Figure 12:
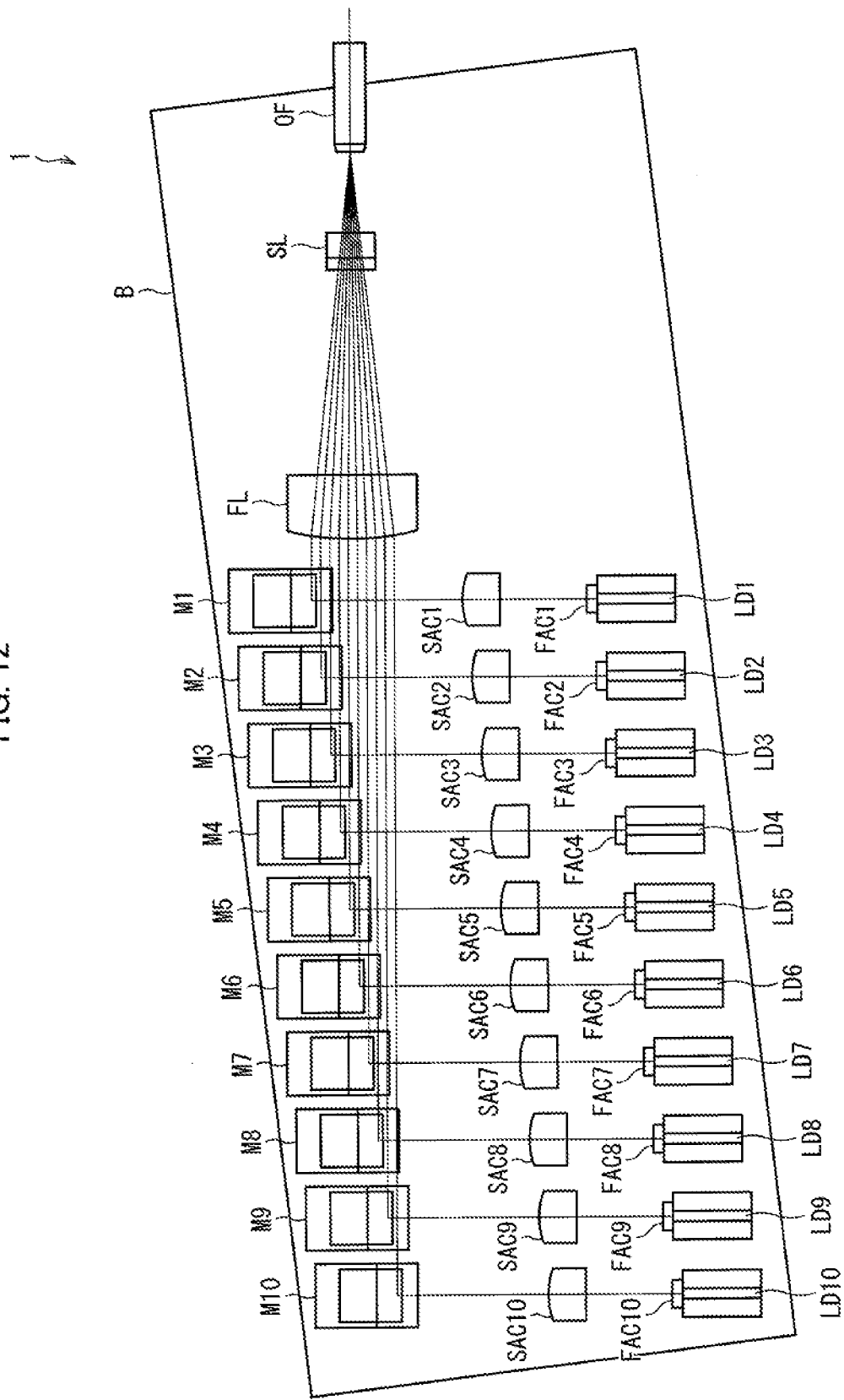

FIG. 12 is a top view illustrating a first variation of the LD module illustrated in FIG. 1.

Figure 13:
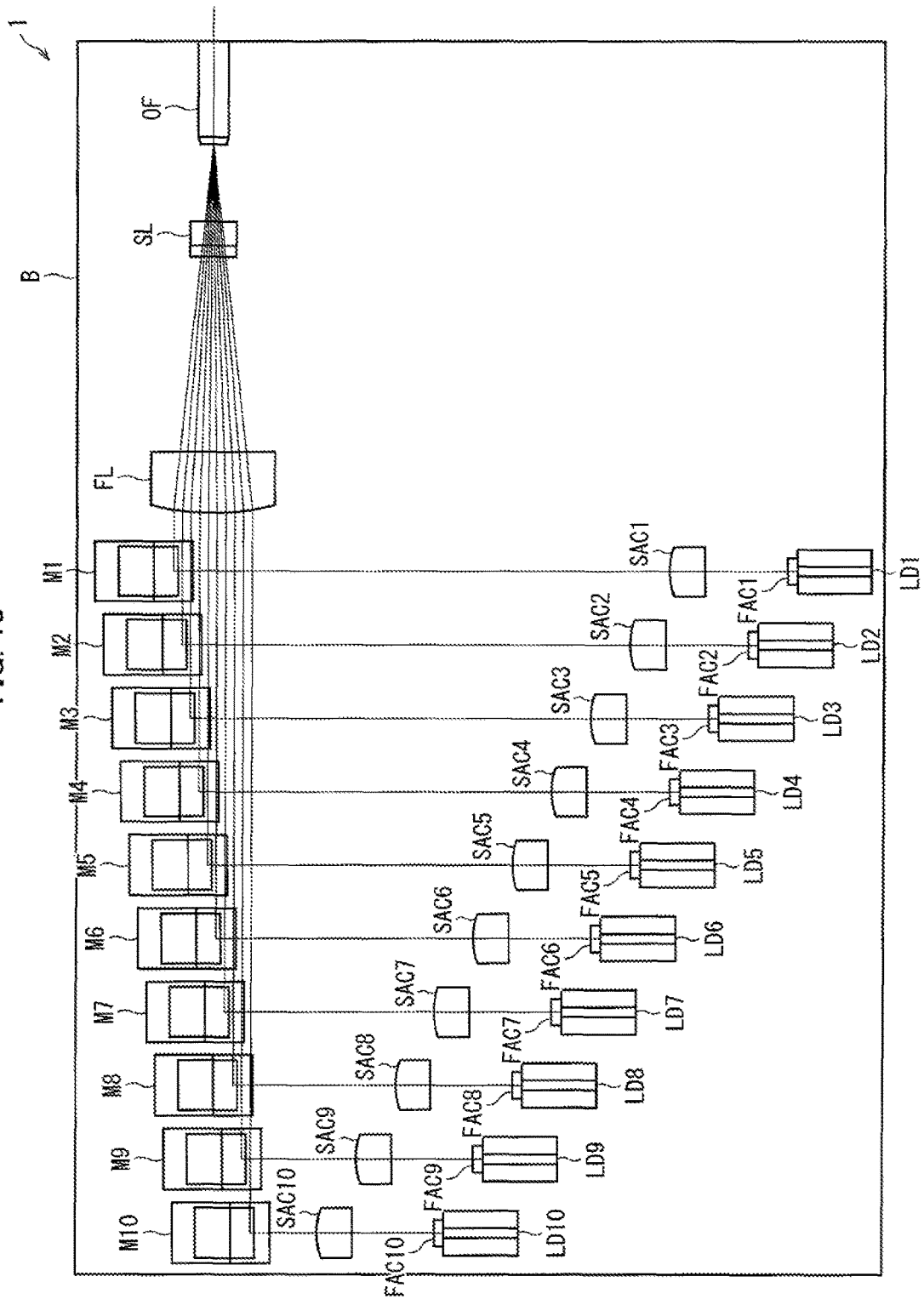

FIG. 13 is a top view illustrating a second variation of the LD module illustrated in FIG. 1.

Figure 14:
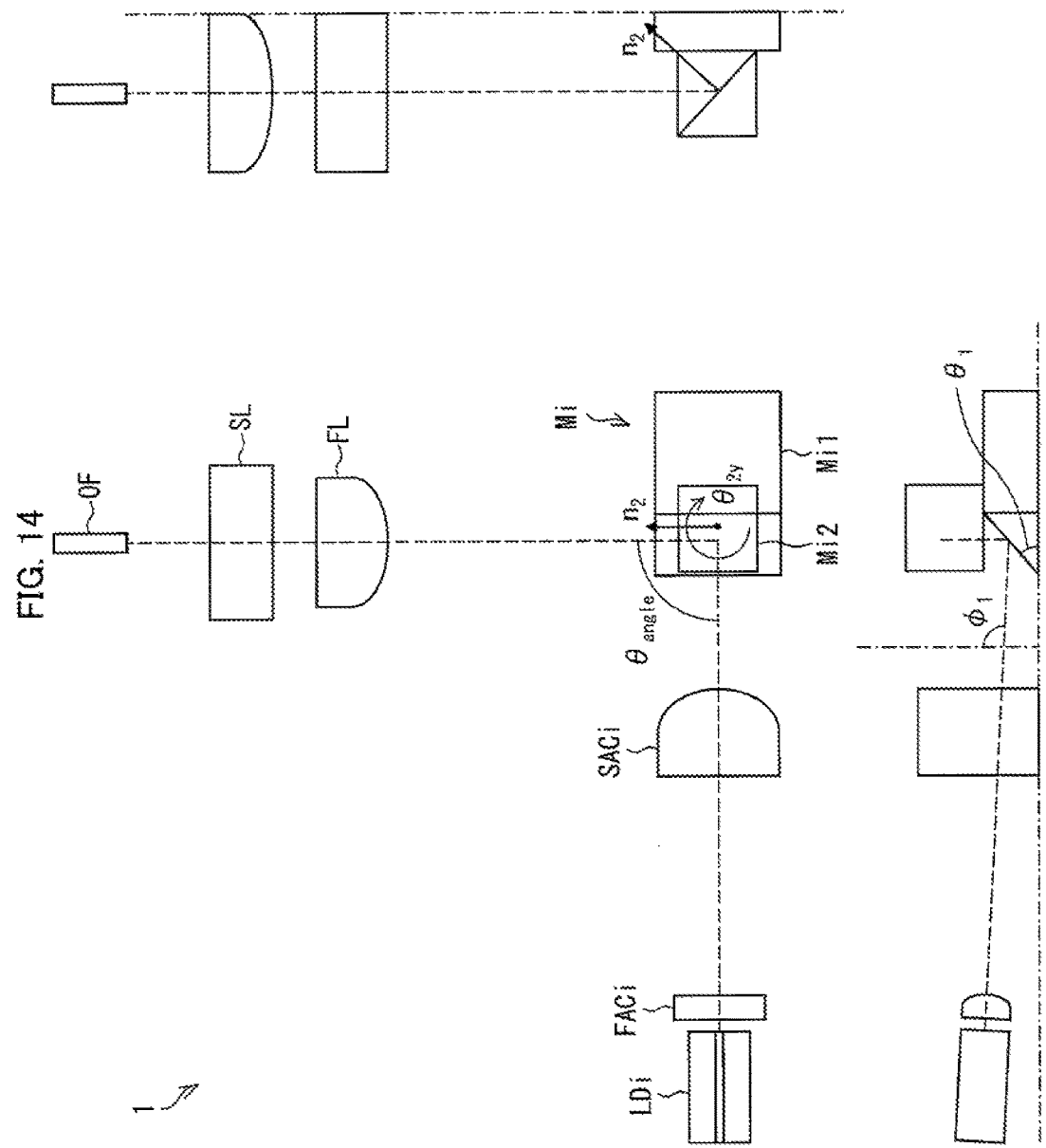

FIG. 14 is a top view illustrating a third variation of the LD module illustrated in FIG. 1.

Figure 15:
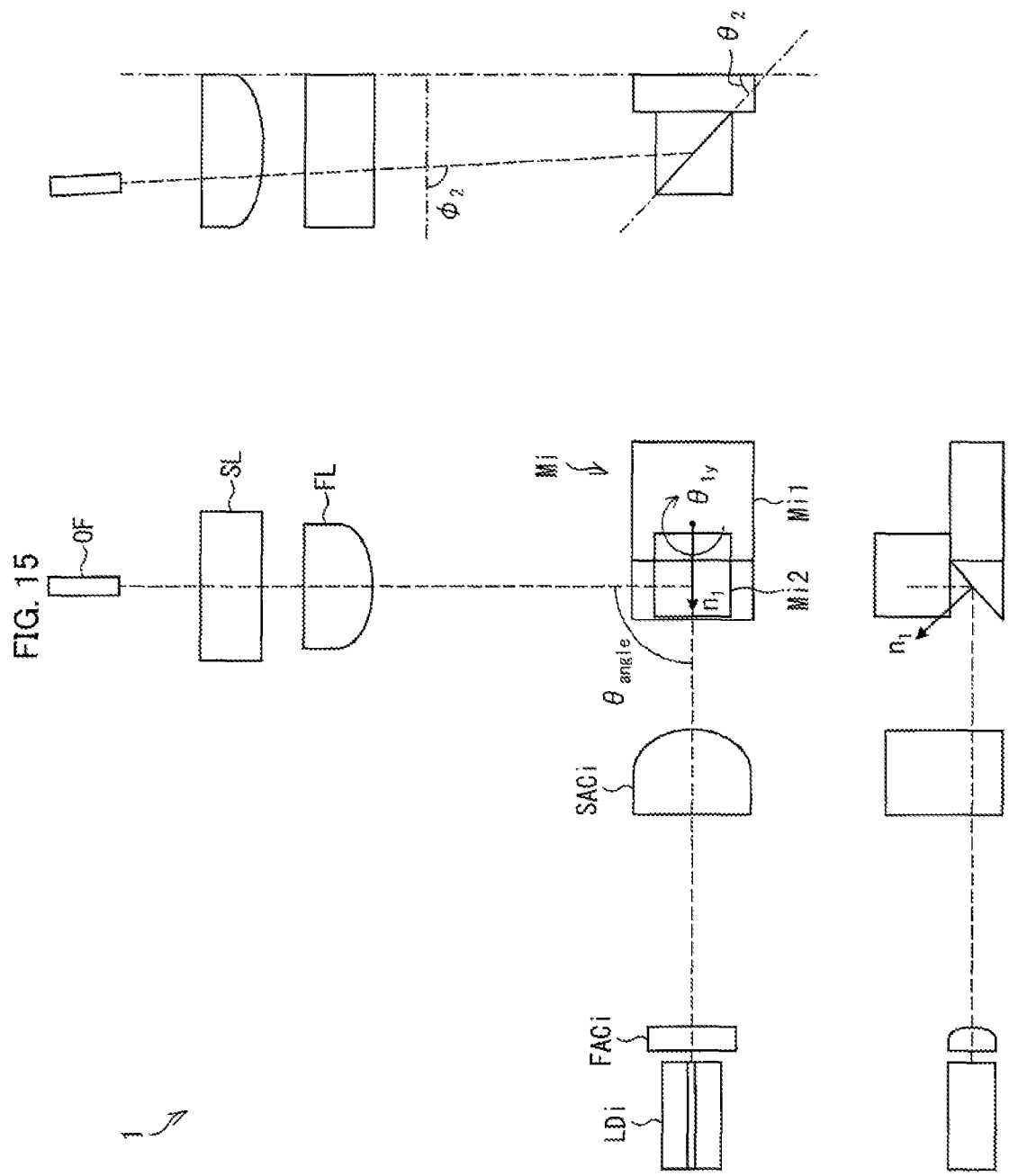

FIG. 15 is a top view illustrating a fourth variation of the LD module illustrated in FIG. 1.

Figure 16:
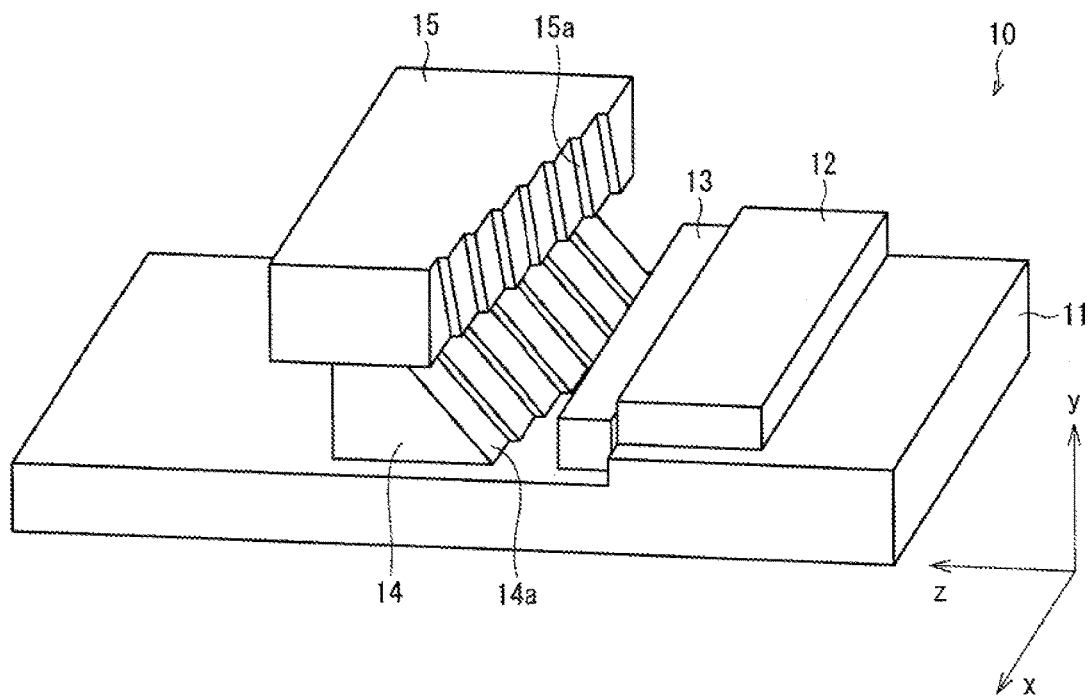

FIG. 16 is a perspective view illustrating a configuration of a conventional micro-optical device.

DESCRIPTION OF EMBODIMENTS

The following discusses an LD module according to one embodiment of the present invention, with reference to drawings.

[Configuration of LD Module]

The following discusses a configuration of an LD module 1 according to the present embodiment, with reference to FIG. 1. FIG. 1 is a top view illustrating the configuration of the LD module 1.

The LD module 1 is a module for coupling laser beams emitted from N LD chips LD1 to LD 10 (N=10 in the present embodiment) to an optical fiber OF. Note that in the present embodiment, the number N of the LD chips provided in the LD module 1 is 10, but in the present invention, the number is not limited to 10. In other words, the number N of LD chips provided in the LD module 1 can be any integer of two or more.

As illustrated in FIG. 1, the LD module 1 includes, in addition to the N LD chips LD1 to LD10, N F-axis collimating lenses FAC1 to FAC10, N S-axis collimating lenses SAC1 to SAC10, N double mirrors M1 to M10, a base plate B, an F-axis light collecting lens FL, and an S-axis light collecting lens SL. All of the LD chips LD1 to L10, the F-axis collimating lenses FAC1 to FAC10, the S-axis collimating lenses SAC1 to SAC10, the double mirrors M1 to M10, the F-axis light collecting lens FL, and the S-axis light collecting lens SL are mounted on the base plate B directly or via a mount (not illustrated).

In the LD module 1, the base plate B, the F-axis collimating lenses FAC1 to FAC10, the S-axis collimating lenses SAC1 to SAC10, and the double mirrors M1 to M10 constitute a light-guiding device corresponding to the conventional micro-optical device 10 (see FIG. 16). This light-guiding device, like the conventional micro-optical device 10, functions to convert an input beam bundle made of laser beams (hereinafter, also referred to as "input beams") that are emitted from the LD chips LD1 to LD10 and propagating in a z-axis positive direction, to an output beam bundle made of laser beams (hereinafter, also referred to as "output beams") that propagates in an x-axis negative direction.

In a light path of this output beam bundle, the F-axis light collecting lens FL and the S-axis light collecting lens SL are provided. The F-axis light collecting lens FL refracts the output beams constituting the output beam bundle so that intervals of the output beams become the smallest at an incident edge surface of the optical fiber OF (preferably, 0). Further, the S-axis light collecting lens SL converges the output beams constituting the output beam bundle so that a beam diameter in a y-axis direction becomes minimum (preferably, 0) at the incident edge surface of the optical fiber OF As illustrated in FIG. 1, the LD module 1 includes an optical system, as a unit, that includes an LD chip LDi, an F-axis collimating lens FACi, an S-axis collimating lens SACi, and a double mirror Mi. FIG. 1 illustrates, as an example, a unit optical system S1 which includes the LD chip LD1, the F-axis collimating lens FAC1, the S-axis collimating lens SAC1, and the double mirror M1.

[Configuration of Unit Optical System]

Figure 2:
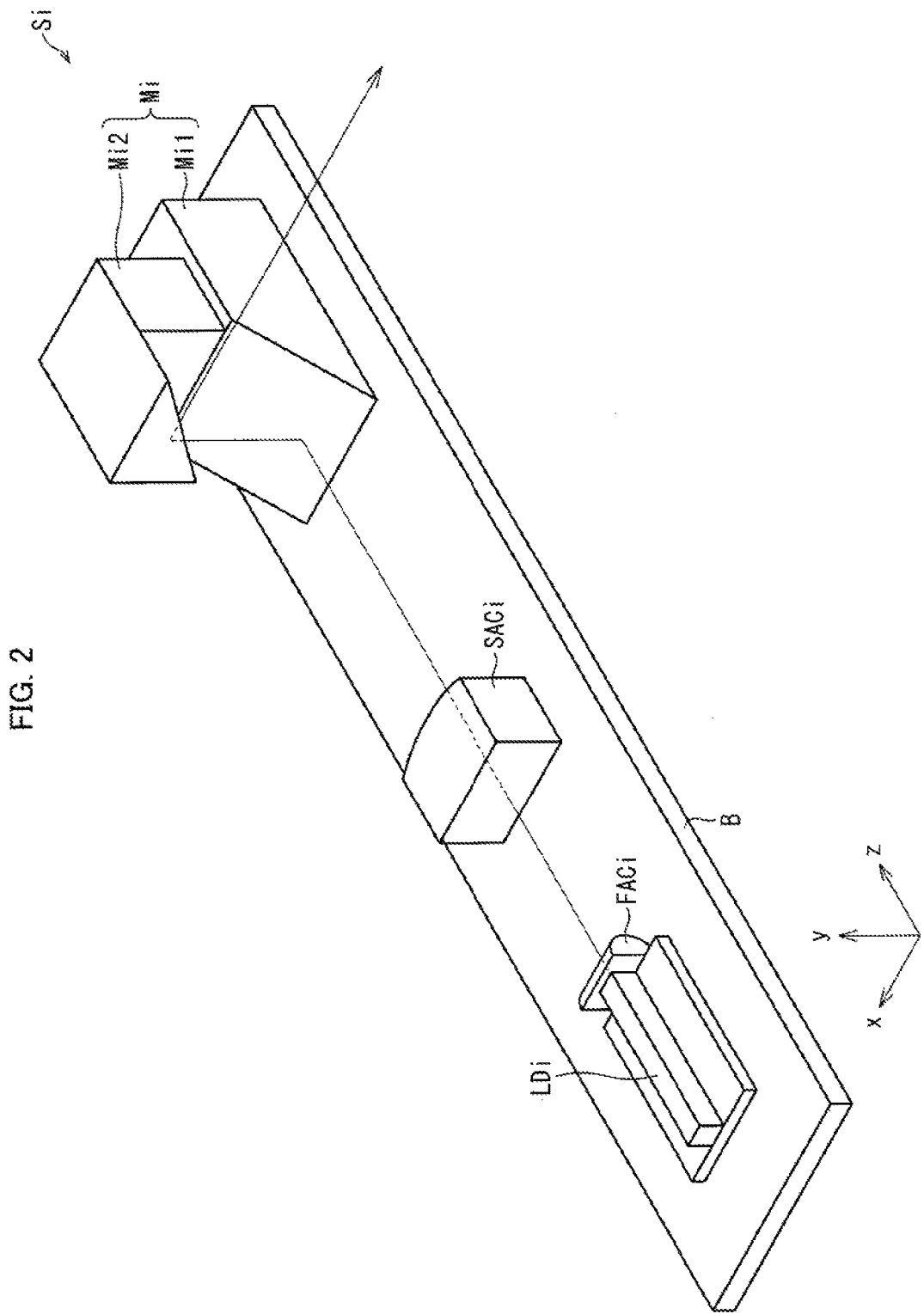
FIG. 2 is a perspective view illustrating a configuration of a unit optical system provided in the LD module illustrated in FIG. 1.

The following discusses a configuration of a unit optical system Si provided in the LD module 1, with reference to FIG. 2. FIG. 2 is a perspective view illustrating a configuration of the unit optical system Si. As illustrated in FIG. 2, the unit optical system Si includes an LD chip LDi, an F-axis collimating lens FACi, an S-axis collimating lens SACi, and a double mirror Mi.

The LD chip LDi is mounted on the base plate B so that an active layer becomes parallel to a zx plane and an emission edge surface faces in the z-axis positive direction. Accordingly, a laser beam emitted from this LD chip LDi has a propagation direction that is parallel to the z-axis positive direction, an F axis that is parallel to a y axis, and an S axis that is parallel to an x axis.

Note that the N LD chips LD1 to LD10 are aligned along the x axis, as illustrated in FIG. 1. Therefore, optical axes of the laser beams emitted in the z-axis positive direction from the LD chips LDi are aligned in parallel to one another along the x axis in a first plane that is parallel to the zx plane.

In a light path of the laser beam emitted from the LD chip LDi, the F-axis collimating lens FACi and the S-axis collimating lens SACi are provided. The F-axis collimating lens FACi is a lens for reducing, by collimation, a divergence of the laser beam emitted from the LD chip LDi in an F-axis direction. Meanwhile, the S-axis collimating lens SACi is a lens for reducing, by collimation, a divergence of the laser beam emitted from the LD chip LDi in an S-axis direction. The laser beam having transmitted the F-axis collimating lens FACi and the S-axis collimating lens SACi becomes a collimated beam whose propagation direction is converged in the z-axis positive direction. Note that in a case where the divergence of the laser beam emitted from the LD chip LDi in the S-axis direction is sufficiently small, the S-axis collimating lens SACi can be omitted.

In the light path of the laser beam emitted from the LD chip LDi, the double mirror Mi is further provided. The double mirror Mi is made of first mirror Mi1 mounted on the base plate B and a second mirror Mi2 mounted on the first mirror Mi1. The first mirror Mi1 reflects the laser beam emitted from the LD chip LDi, and changes the propagation direction of the laser beam from the z-axis positive direction to a y-axis positive direction. The first mirror Mi1 is also called a "flip-up mirror". Further, the second mirror Mi2 reflects the laser beam that has been reflected by the first mirror Mi1 so that the propagation direction of the laser beam is changed from the y-axis positive direction to the x-axis negative direction. The second mirror Mi2 is also called a "folding mirror".

Note that as illustrated in FIG. 1, a double mirror Mi+1 that reflects a laser beam emitted from an (i+1)th LD element Di+1 (as counted in a direction from the x-axis negative side to the x-axis positive side) is provided on a z-axis negative direction side of a double mirror Mi that reflects a laser beam emitted from an i-th LD element Di (as counted in the direction from the x-axis positive side to the x-axis negative side). On this account, optical axes of the laser beams reflected by these double mirrors Mi are aligned along a z axis in a second plane that is parallel to the zx plane. This second plain is at a position that is on a y-axis positive direction side of the first plane as described above.

[Configuration of Double Mirror]

Figure 3:
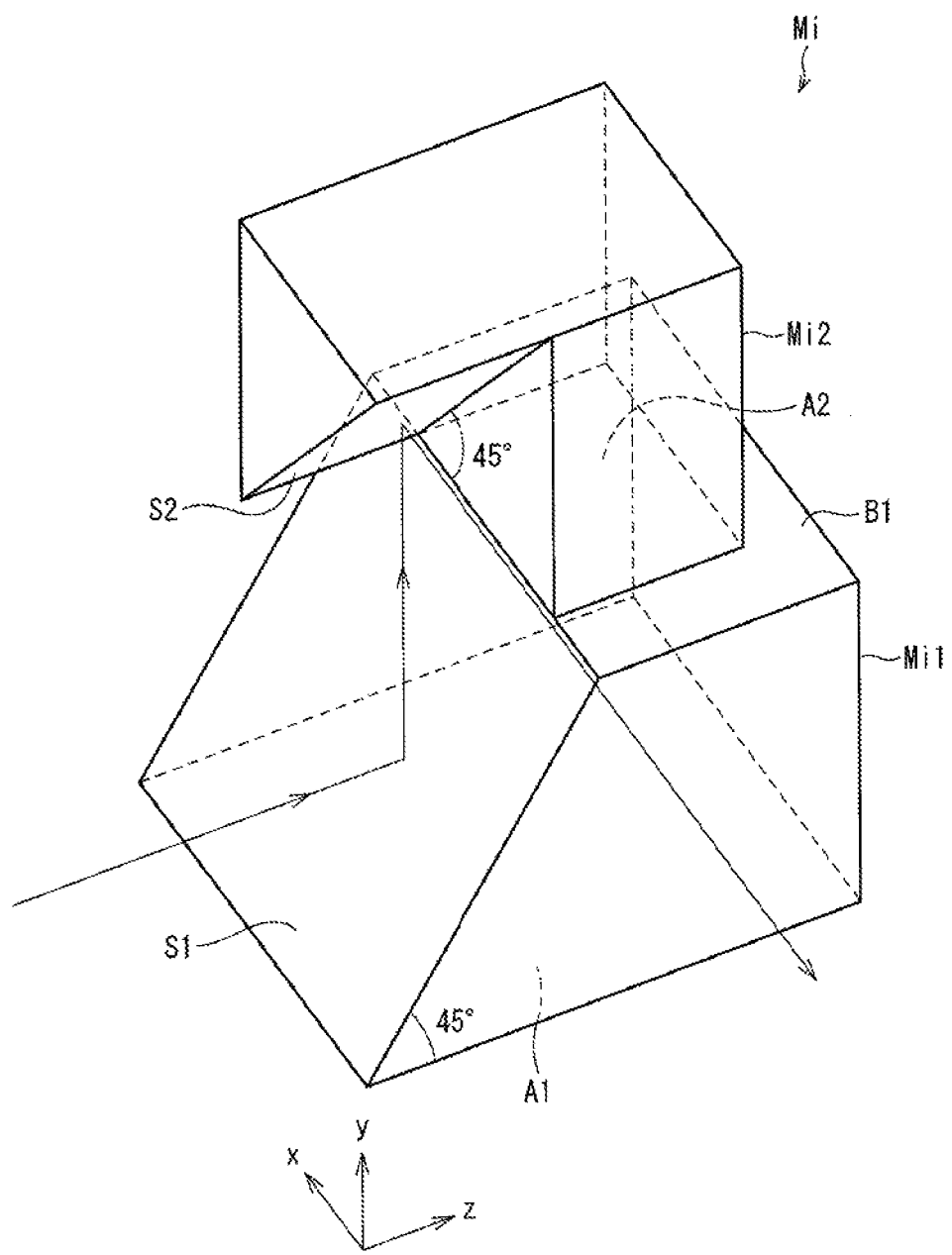
FIG. 3 is a perspective view illustrating a configuration of a double mirror provided in the LD module illustrated in FIG. 1.

The following discusses a configuration of the double mirror Mi provided in the LD module 1, with reference to FIG. 3. FIG. 3 is a perspective view illustrating the configuration of the double mirror Mi. As illustrated in FIG. 3, the double mirror Mi is made of a first mirror Mi1 and a second mirror Mi2.

The first mirror Mi1 is a polyhedral structure that has a bottom surface A1, a top surface B1 parallel to the bottom surface A1, and a reflective surface S1. The reflective surface S1 and the bottom surface A1 makes an angle of 45°, as illustrated in FIG. 3.

The first mirror Mi1 is mounted on the base plate B so that the bottom surface A1 abuts a top surface of the base plate B (see FIG. 2). As a result, a normal vector of the reflective surface S1 of the first mirror Mi1 (an outward normal vector pointing toward outside the first mirror Mi1 from the reflective surface S1) and a normal vector of the top surface (zx plane) of the base plate B (an outward normal vector pointing toward outside the base plate B from the top surface of the base plate B) makes an angle of 45°. Further, an orientation of the first mirror Mi1 is determined so that a normal of the reflective surface S1 becomes parallel to a yz plane. As a result, the reflective surface S1 of the first mirror Mi1 reflects an incident laser beam from the z-axis negative direction into the y-axis positive direction.

The second mirror Mi2 is a polyhedral structure that has at least a bottom surface A2 and a reflective surface S2. The reflective surface S2 and the bottom surface A2 makes an angle of 45° as illustrated in FIG. 3.

The second mirror Mi2 is mounted on the first mirror Mi1 so that the bottom surface A2 abuts the top surface B1 of the first mirror Mi1. As a result, a normal vector of the reflective surface S2 of the second mirror Mi2 (an outward normal vector pointing toward outside the second mirror Mi2 from the reflective surface S2) and the normal vector of the top surface (zx plane) of the base plate B (an outward normal vector pointing toward outside the base plate B from the top surface of the base plate B) makes an angle of 135°. Further, an orientation of the second mirror Mi2 is determined so that a normal of the reflective surface S2 becomes parallel to an xy plane. As a result, the reflective surface S2 of the second mirror Mi2 reflects an incident laser beam from a y-axis negative direction into the x-axis negative direction.

The LD module 1 allows a propagation direction of an output beam to coincide with the x-axis negative direction, by adjusting the orientations of the first mirror Mi1 and the second mirror Mi2 that constitute each double mirror Mi. This is because minute rotation of the first mirror Mi1 around the y axis as a rotation axis causes minute rotation of the propagation direction of the output beam and minute rotation of the second mirror Mi2 around the y axis as a rotation axis causes minute rotation of the propagation direction of the output beam.

Further, in the LD module 1, optical axes of output beams can be aligned at equal intervals within a plane parallel to the xz plane, by adjusting positions of the first mirror Mi1 and the second mirror Mi2 that constitute each double mirror Mi. This is for the following reason: when the first mirror Mi1 is translated in the z-axis positive direction or in the z-axis negative direction, the optical axes of the output beams are translated in the z-axis positive direction or in the z-axis negative direction; and when the second mirror Mi2 is translated in the x-axis positive direction or in the x-axis negative direction, the optical axes of the output beams are translated in the y-axis positive direction or in the y-axis negative direction.

Note that in the present embodiment, a first aim of such adjustment is to make propagation directions of the output beams constituting the output beam bundle coincide with the x-axis negative direction. However, the present invention is not limited to this. In other words, it is sufficient if it is possible to make the propagation directions of the output beams constituting the output beam coincide with a certain direction and this certain direction is not limited to the x-axis negative direction.

Further, in the present embodiment, a second aim of such adjustment is to align optical axes of the output beams constituting the output beam bundle at equal intervals in a plane parallel to the zx plane. However, the present invention is not limited to this. In other words, it is sufficient if it is possible to align the optical axes of the output beams constituting the output beam bundle at equal intervals in a certain plane and this certain plane is not limited to the plane parallel to the zx plane.

[Reason why Minute Rotation of Mirrors Causes Rotation of Output Beam]

Figure 4:
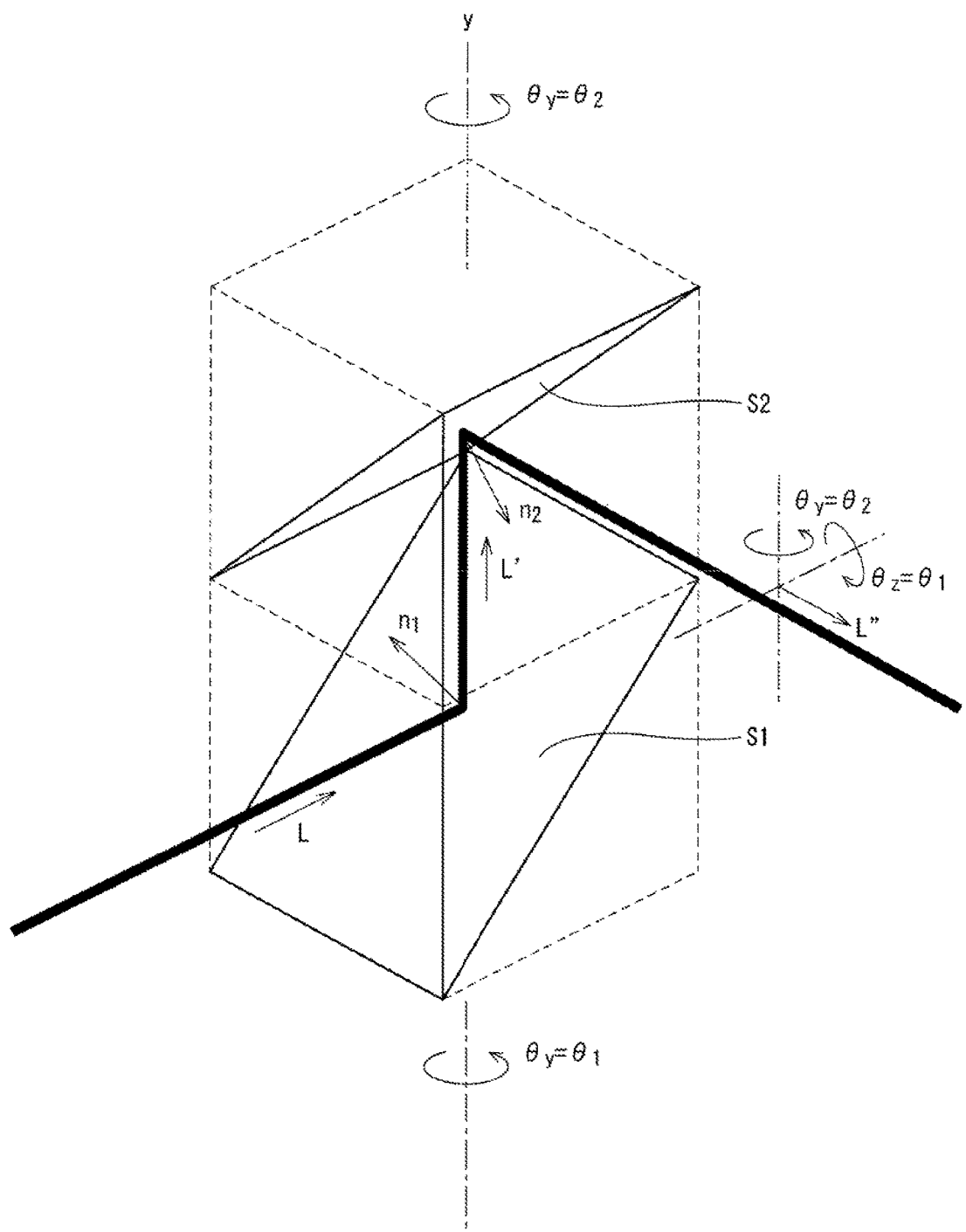
FIG. 4 is a view for illustrating that minute rotation of a first mirror and a second mirror provided in the double mirror illustrated in FIG. 3 causes minute rotation of a propagation direction of an output beam.

The following discusses a reason why minute rotation of the first mirror Mi1 and the second mirror Mi2 causes minute rotation of the output beam, with reference to FIG. 4.

On the assumption that a directional vector of an incident light (input beam) incident on the first reflective surface S1 is L, a directional vector L' of a reflected light outgoing from the first reflective surface S1 can be expressed as follows:

$$L' = L - 2(L \cdot n1)n1 \quad (1)$$

where n1 is the normal vector of the first reflective surface S1 and (L·n1) is an inner product of the directional vector L and the normal vector n1.

Similarly, on the assumption that a directional vector of an incident light (input beam) incident on the second reflective surface S2 is L', a directional vector L" of a reflected light (output beam) outgoing from the second reflective surface S2 can be expressed as follows:

$$L'' = L' - 2(L' \cdot n2)n2 \quad (2)$$

where n2 is the normal vector of the second reflective surface S2 and (L'·n2) is an inner product of the directional vector L' and the normal vector n2.

Accordingly, when the directional vector of the incident light incident on the first reflective surface S1 is L, the directional vector L" of the reflected light outgoing from the second reflective surface S2 can be expressed as follows:

$$L'' = L - 2(L \cdot n1)n1 - 2\{(L \cdot n2) - 2(L \cdot n1)(n1 \cdot n2)\}n2 \quad (3)$$

As for the normal vectors, when the first mirror Mi1 is rotated by θy=θ1 around the y axis as a rotation angle, the normal vector n1 of the first reflective surface S1 changes from $n1 = (½)^{1/2}(0, 1, -1)$ to $n1 = (½)^{1/2}(-\sin θ1, 1, -\cos θ1)$. Further, when the second mirror Mi2 is rotated by θy=θ2 around the y axis as a rotation axis, the normal vector n2 of the second reflective surface S2 changes from $n2 = (½)^{1/2}(-1, -1, 0)$ to $n2 = (½)^{1/2}(-\cos θ2, -1, \sin θ2)$.

In this case, respective components (L"x, L"y, L"z) of the directional vector L" of the reflected light outgoing from the second reflective surface S2 are given as follows according to the expression (3):

$$L''x = \sin 2θ1 \cdot \cos θ2 \cdot \sin θ2 - \cos θ1 \cdot \sin θ1 \cdot \sin 2θ2 - \cos θ1 \cdot \cos θ2 \quad (4)$$

$$L''y = \sin 2θ1 \cdot \sin θ2 + \cos θ1 \cdot \sin θ1 \cdot \cos θ2 \quad (5)$$

$$L''z = \sin 2θ1 \cdot \cos 2θ2 + \cos θ1 \cdot \sin θ2(1 - \sin θ1 \cdot \cos θ2) \quad (6)$$

In a case where θ1 and θ2 are sufficiently small, the following approximations are possible: sin θ1=θ1, cos θ=1, sin θ2=θ2, and cos θ2=1. When these approximated values are substituted into the expressions (4) to (6), the following expression that approximates the directional vector L" of the reflected light outgoing from the second reflective surface S2 can be obtained in disregard of minute amounts ($θ1^2$, $θ2^2$, θ1×θ2, etc.) of second or higher degree.

$$L'' = (-1, θ1, θ2) \quad (7)$$

The following is clear from this expression (7). That is, when the first mirror Mi1 is minutely rotated by θy=θ1 around the y axis as a rotation axis, the directional vector L" of the reflected light outgoing from the second reflective surface S2 minutely rotates by θz=θ1 around the z axis as a rotation axis, as illustrated in FIG. 4. Meanwhile, when the second mirror Mi2 is minutely rotated by θy=θ2 around the y axis as a rotation axis, the directional vector L" of the reflected light outgoing from the second reflective surface S2 minutely rotates by θy=θ2 around the y axis as a rotation axis, as illustrated in FIG. 4.

[Method of Adjusting Orientations and Positions of Mirrors]

Figure 5:
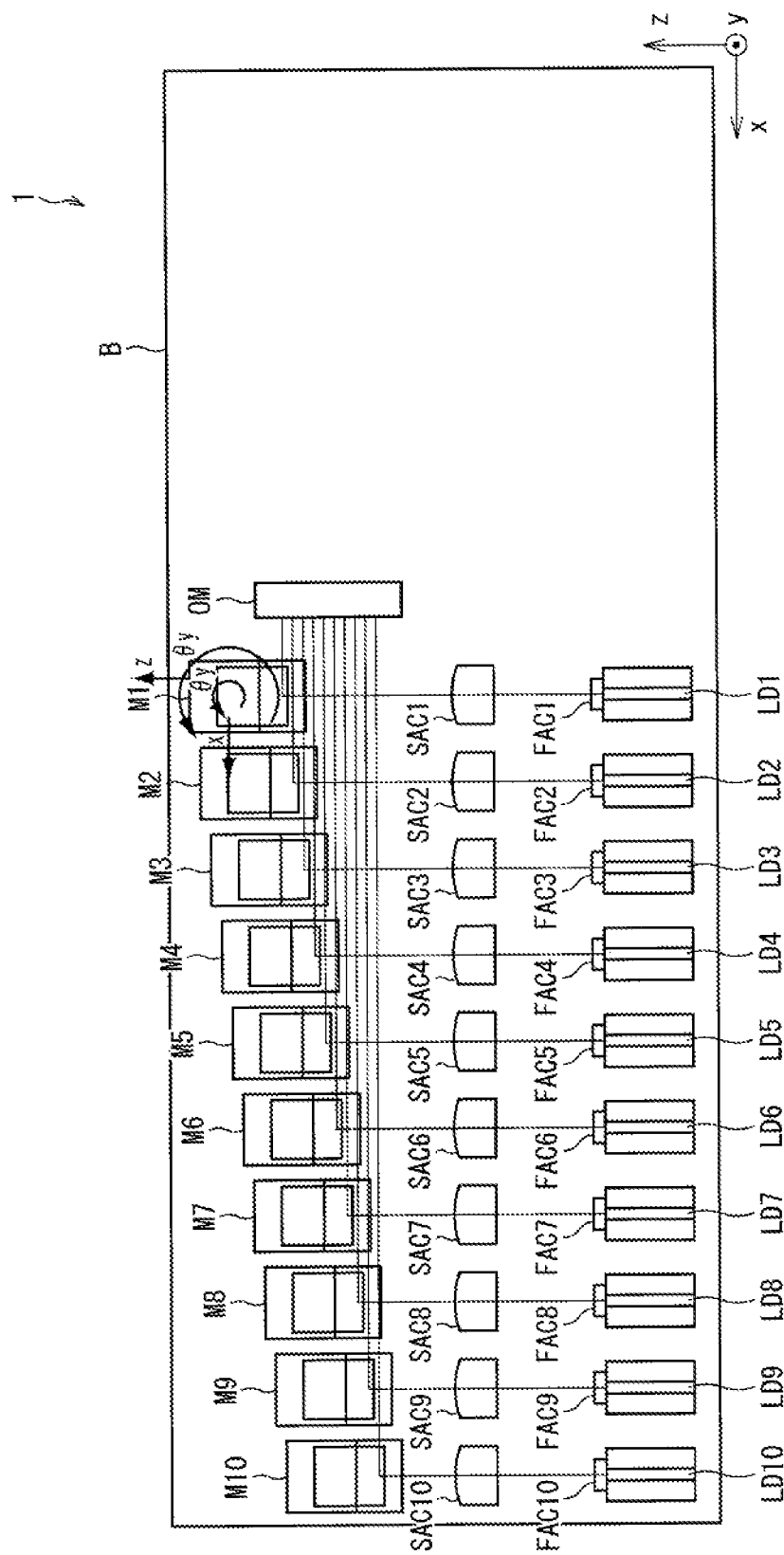
FIG. 5 is a top view illustrating a configuration of an LD module in a case where an adjustment method shown in FIG. 6 is carried out.

The following discusses a method of adjusting an orientation and a position of each of the first mirror Mi1 and the second mirror Mi2, with reference to FIGS. 5 to 11. FIG. 5 is a top view illustrating a configuration of the LD module 1 in a case where this adjustment method is carried out. FIG. 6 is a flow chart illustrating a flow of the adjustment method. FIGS. 7 to 10 are views illustrating, respectively, steps of the adjustment method. FIG. 11 is a view illustrating positions of output beams that serve as adjustment targets in the adjustment method.

The present adjustment method is carried out by use of an optical monitor device OM, as illustrated in FIG. 5. The optical monitor device OM is a device for detecting orientations and positions of incident laser beams. This optical monitor device OM is provided in the light path of the output beam bundle at the time when the present adjustment method is carried out. Further, the present adjustment method is carried out in a state where the bottom surface of the first mirror Mi1, to which bottom surface an adhesive is applied, is mounted on the base plate B, and the bottom surface of the second mirror Mi2, to which bottom surface an adhesive is applied, is mounted on the first mirror Mi1. These adhesives are cured by UV light or the like after the present adjustment method is carried out.

As illustrated in FIG. 6, the present adjustment method is carried out by repeating for each double mirror Mi a first-mirror rotating step T1, a second-mirror rotating step T2, a first-mirror sliding step T3, and a second-mirror sliding step T4.

The first-mirror rotating step T1 is a step in which a propagation direction of an output beam is minutely rotated around the z axis as a rotation axis by causing minute rotation of the first mirror Mi1 around the y axis as a rotation axis. More specifically, in this step T1, the first mirror Mi1 is minutely rotated (rotation around the y axis as a rotation axis) by use of a rotation stage so that an inclination (an inclination caused by the rotation around the z axis as a rotation axis) of the output beam which inclination is detected by the optical monitor device OM becomes the smallest (preferably, 0).

(a) of FIG. 7 is a top view (upper part) and a front view (lower part) each illustrating, as an example, a state of the double mirror Mi prior to the first-mirror rotating step T1. (b) of FIG. 7 is a top view (upper part) and a front view (lower part) each illustrating, as an example, a state of the double mirror Mi after the first-mirror rotating step T1. As illustrated in the lower part of (a) of FIG. 7, in a case where the propagation direction of the output beam has been minutely rotated by Δθz from an x-axis direction around the z axis as a rotation axis, the first mirror Mi1 is minutely rotated around the y axis as a rotation axis as illustrated in the upper part of (a) of FIG. 7. This makes the propagation direction of the output beam coincide with the x-axis negative direction as illustrated in the lower part of (b) of FIG. 7.

The second-mirror rotating step T2 is a step in which the propagation direction of the output beam is minutely rotated around the y axis as a rotation axis by causing minute rotation of the second mirror Mi2 around the y axis as a rotation axis. More specifically, in this step T2, the first mirror Mi2 is minutely rotated (rotation around the y axis as a rotation axis) by use of a rotation stage so that an inclination (an inclination caused by the rotation around the y axis as a rotation axis) of the output beam which inclination is detected by the optical monitor device OM becomes the smallest (preferably, 0).

(a) of FIG. 8 is a top view (upper part) and a side view (lower part) each illustrating, as an example, a state of the double mirror Mi prior to the second-mirror rotating step T2. (b) of FIG. 8 is a top view (upper part) and a side view (lower part) each illustrating, as an example, a state of the double mirror Mi after the second-mirror rotating step T2. As illustrated in the upper part of (a) of FIG. 8, in a case where the propagation direction of the output beam has been minutely rotated by Δθy from the x-axis direction around the y axis as a rotation axis, the second mirror Mi2 is minutely rotated around the y axis as a rotation axis, as illustrated in the upper part of (a) of FIG. 8. This makes the propagation direction of the output beam coincide with the x-axis negative direction, as illustrated in the upper part of (b) of FIG. 8.

The first aim of the adjustment is to make propagation directions of respective output beams constituting an output beam bundle coincide with the x-axis negative direction, and this first aim of the adjustment can be achieved by carrying out the first-mirror rotating step T1 and the second-mirror rotating step T2.

The first-mirror sliding step T3 is a step in which an optical axis of the output beam is translated in parallel to the z axis, by translating the first mirror Mi1 in parallel to the z axis. More specifically, this step T3 is a step in which the first mirror Mi1 is translated in parallel to the z axis by use of a position controlling stage so that a z-coordinate of the output beam which is detected by the optical monitor device OM becomes a predetermined adjustment target value.

(a) of FIG. 9 is a side view illustrating, as an example, a state of the double mirror Mi prior to the first-mirror sliding step T3. (b) of FIG. 9 is a side view illustrating, as an example, a state of the double mirror Mi after the first-mirror sliding step T3. As illustrated in (a) of FIG. 9, in a case where the optical axis of the output beam has been shifted by Δz in the z-axis positive direction, the first mirror Mi1 is translated in the z-axis negative direction. This eliminates such a shift of the optical axis of the output beam in the z-axis direction, as illustrated in (b) of FIG. 9.

The second-mirror sliding step T4 is a step in which the optical axis of the output beam is translated in parallel to the y axis, by translating the second mirror Mi2 in parallel to the x axis. More specifically, this step T4 is a step in which the second mirror Mi2 is translated in parallel to the x axis by use of a position controlling stage so that a y-coordinate of the output beam detected by the optical monitor device OM becomes a predetermined adjustment target value.

(a) of FIG. 10 is a front view illustrating, as an example, a state of the double mirror Mi prior to the second-mirror sliding step T4. (b) of FIG. 10 is a front view illustrating, as an example, a state of the double mirror Mi after the second-mirror sliding step T4. As illustrated in (a) of FIG. 10, in a case where an optical axis of an output beam has been shifted by Δy in the y-axis positive direction, the second mirror Mi2 is translated in the x-axis positive direction. This eliminates such a shift of the optical axis of the output beam in the y-axis direction, as illustrated in (b) of FIG. 10.

The second aim of the adjustment is to align optical axes of the respective output beams constituting the output beam bundle at equal intervals in a plane that is parallel to the zx plane, and this second aim of the adjustment can be achieved by carrying out the first-mirror sliding step T3 and the second-mirror sliding step T4.

In a case where the second aim of the adjustment is to align the optical axes of the respective output beams constituting the output beam bundle within a plane that is parallel to the zx plane, the adjustment target values that are to be referred to in the first-mirror sliding step T3 and the second-mirror sliding step T4 should be determined as illustrated in FIG. 11. That is, the adjustment target values should be determined so that beam spots Li of the respective output beams are aligned at equal intervals on the z axis on a light-receiving surface of the optical monitor device OM.

Note that, as illustrated in FIG. 6, the first-mirror sliding step T3 and the second-mirror sliding step T4 are preferably carried out after the propagation directions of the respective output beams constituting the output beam bundle are made parallel to one another by carrying out the first-mirror rotating step T1 and the second-mirror rotating step T2. However, the order in which the first-mirror rotating step T1 and the second-mirror rotating step T2 are carried out and the order in which the first-mirror sliding step T3 and the second-mirror sliding step T4 are carried out are not limited to those shown in FIG. 6. In other words, it is possible to employ a configuration in which the first-mirror rotating step T1 is carried out after the second-mirror rotating step T2 is carried out and/or a configuration in which the first-mirror sliding step T3 is carried out after the second-mirror sliding step T4 is carried out.

Further, in a case where an adhesive is used for fixing the first mirror Mi1 to the base plate B and for fixing the second mirror Mi2 to the first mirror Mi1, it is preferable to fix the first mirror Mi1 and the second mirror Mi2 as follows. That is, after the adhesive is applied between the bottom surface of the first mirror Mi1 and the top surface of the base plate B and between the bottom surface of the second mirror Mi2 and the top surface of the first mirror Mi1, the first-mirror rotating step T1, the second-mirror rotating step T2, the first-mirror sliding step T3, and the second-mirror sliding step T4 are carried out. Note, however, that in a period in which these steps T1 to T4 are carried out and in a period from the end of these steps through the completion of curing of the adhesive, the top surface and the bottom surface of the first mirror Mi1, the top surface of the base plate B, and the bottom surface of the second mirror Mi2 are kept in a state in which the bottom surface of the first mirror Mi1 and the top surface of the base plate B are parallel to each other and the bottom surface of the second mirror Mi2 and the top surface of the first mirror Mi1 are parallel to each other. This makes it possible to uniformize a thickness of an adhesive layer formed between the bottom surface of the first mirror Mi1 and the top surface of the base plate B and a thickness of an adhesive layer formed between the bottom surface of the second mirror Mi2 and the top surface of the first mirror Mi1.

If the thickness of the adhesive layer formed between the top surface of the base plate B and the bottom surface of the first mirror Mi1 is uniform, an amount of expansion or shrinkage becomes equal at any position even in a case where the adhesive layer expands or shrinks. Accordingly, even in a case where the adhesive layer expands or shrinks, only parallel shift of the first mirror Mi1 occurs in a direction that is orthogonal to the top surface of the base plate B (a thickness direction of the adhesive layer), and the top surface of the base plate B and the bottom surface of the first mirror Mi1 stay parallel to each other. Similarly, if the thickness of the adhesive layer formed between the top surface of the first mirror Mi1 and the bottom surface of the second mirror Mi2 is uniform, only parallel shift of the second mirror Mi2 occurs in a direction that is orthogonal to the top surface of the first mirror Mi1, and the top surface of the first mirror Mi1 and the bottom surface of the second mirror Mi2 stay parallel to each other even in a case where the adhesive layer expands or shrinks. Accordingly, if the thickness of each of these adhesive layers is uniform, it is possible to avoid the occurrence of, for example, a case where a propagation direction of an output beam inclines or a case where alignment of the optical axes of the output beams is lost even in a case where the adhesive layers shrink or expand. Note that possible shrinkage or expansion of these adhesive layers are cure shrinkage that may occur when the adhesive is cured, a thermal expansion that may occur after the adhesive is cured, a thermal shrinkage, swelling, or the like.

Furthermore, preferably, each of the thickness of the adhesive layer formed between the top surface of the base plate B and the bottom surface of the first mirror Mi1 and the thickness of the adhesive layer formed between the top surface of the first mirror Mi1 and the bottom surface of the second mirror Mi2 is made as small as possible in a range that can ensure a required adhesive force. A smaller thickness of each of these adhesive layers results in a smaller amount of change in thickness that occurs in a case where each of these adhesive layers expands or shrinks. This consequently makes it easily to keep the top surface of the base plate B and the bottom surface of the first mirror Mi1 parallel to each other and also keep the top surface of the first mirror Mi1 and the bottom surface of the second mirror Mi2 parallel to each other. Particularly, it is preferable that each of (a) the thickness of the adhesive layer formed between the top surface of the base plate B and the bottom surface of the first mirror Mi1 and (b) the thickness of the adhesive layer formed between the top surface of the first mirror Mi1 and the bottom surface of the second mirror Mi2 be smaller than a tolerance of the base plate B (more specifically, a tolerance of a thickness of the base plate B) and also be smaller than a dimensional tolerance of the double mirror Mi (more specifically, a tolerance of a thickness of the first mirror Mi1 or a thickness of the second mirror Mi2). In this case, an amount of change in thickness that occurs in a case where each of the adhesive layers expands or shrinks becomes also smaller than each of the dimensional tolerance of the double mirror Mi and the dimensional tolerance of the base plate B (in general, the amount of change in thickness of each of the adhesive layers is smaller than the thickness of each of the adhesive layers). Therefore, even in a case where these adhesive layers expand or shrink, a degree of parallelism of the top surface of the base plate B and the bottom surface of the first mirror Mi1 and a degree of parallelism of the top surface of the first mirror Mi1 and the bottom surface of the second mirror Mi2 never become lower than a degree accepted in designing regardless of whether or not the thicknesses of the adhesive layers are uniform.

[Variation 1]

Note that although the present embodiment has discussed a configuration where the LD chips LD1 to LD10 are provided along the x axis, the present invention is not limited to this configuration.

For example, as illustrated in FIG. 12, the LD chips LD1 to LD10 each may be provided obliquely in a manner such that a light path length from an LD chip LDi to a double mirror Mi becomes constant. In this case, it is possible to reduce a size of the base plate B as illustrated in FIG. 12.

Alternatively, as illustrated in FIG. 13, the LD chips LD1 to LD10 may be provided along an oblique line in a manner such that a light path length from an LD chip LDi to the F-axis light collecting lens FL becomes constant. In this case, beam radii of the laser beams incident on the F-axis light collecting lens L become the same. Accordingly, the output beam bundle can be converged more precisely.

[Variation 2]

Note that the present embodiment has discussed a configuration where a reflective surface S1 of a first mirror Mi1 and a top surface of a base plate B in each double mirror Mi makes an angle θ1 of 45° (an outward normal vector pointing toward outside the first mirror Mi1 from the reflective surface S1 and an outward normal vector pointing toward outside the base plate B from the top surface makes an angle of 45°). However, the present invention is not limited to this configuration.

Alternatively, as illustrated in FIG. 14, the angle θ1 between the reflective surface S1 of the first mirror Mi1 and the top surface of the base plate B does not need to be 45°, but can be an angle that satisfies the following expression:

$$(90°-\theta_{angle})=-\theta 2y \times 2-(90°-\varphi 1) \times 2-(90°-\theta 1 \times 2)$$

where (i) φ1 is an angle between (a) an optical axis of a laser beam emitted from an LD chip LDi (in the present embodiment, an optical axis of the laser beam which has been transmitted through an F-axis collimating lens FACi and an S-axis collimating lens SACi) and (b) a normal of the top surface of the base plate B, (ii) $\theta_{angle}$ is an angle between (a) the optical axis of the laser beam emitted from the LD chip LDi and (b) an optical axis of a laser beam incident on an optical fiber OF (in the present embodiment, an optical axis of the laser beam before the laser beam enters an F-axis light collecting lens FL and an S-axis light collecting SL), and (iii) θ2y is a rotation angle of a second mirror Mi2 of a double mirror Mi. To describe the rotation angle θ2y more specifically, the rotation angle θ2y is an angle which shows how much the second mirror Mi2 has rotated from a reference direction around a y axis (axis orthogonal to the top surface of the base plate) serving as a rotation axis, which reference direction is a direction of the double mirror Mi while an orthogonal projection of a normal vector n2 of the reflective surface S2 onto the top surface of the base plate is orthogonal to an orthogonal projection of the optical axis of the laser beam emitted from the LD chip LDi onto the top surface of the base plate.

Note also that the present embodiment has discussed a configuration where a reflective surface S2 of a second mirror Mi2 and a top surface of a base plate B in each double mirror Mi makes an angle θ2 of 45° (an outward normal vector pointing toward outside the second mirror Mi2 from the reflective surface S2 and an outward normal vector pointing toward outside the base plate B from the top surface makes an angle of 135°). However, the present invention is not limited to this configuration.

Alternatively, as illustrated in FIG. 15, the angle θ2 between the reflective surface S2 of the second mirror Mi2 and the top surface of the base plate B does not need to be 45°, but can be an angle that satisfies the following expression:

$$(90"-\varphi 2)=-\theta 1y \times 2-(90°-\theta 2 \times 2)$$

where (i) φ2 is an angle between (a) an optical axis of a laser beam incident on an optical fiber OF (in the present embodiment, an optical axis of the laser beam before the laser beam enters an F-axis light collecting lens FL and an S-axis light collecting SL) and (b) a normal of the top surface of the base plate B, (ii) $\theta_{angle}$ is an angle between (a) an optical axis of a laser beam emitted from an LD chip LDi (in the present embodiment, an optical axis of the laser beam which has been transmitted through an F-axis collimating lens FACi and a S-axis collimating lens SACi) and (b) the optical axis of the laser beam incident on the optical fiber OF, and (iii) θ1y is a rotation angle of a first mirror Mi1 of a double mirror Mi. To describe the rotation angle θ1y more specifically, the rotation angle θ1y is an angle which shows how much the first mirror Mi1 has rotated from a reference direction around a y axis (axis orthogonal to the top surface of the base plate) serving as a rotation axis, which reference direction is a direction of the double mirror Mi while an orthogonal projection of a normal vector n1 of the reflective surface S1 onto the top surface of the base plate is parallel to an orthogonal projection of the optical axis of the laser beam emitted from the LD chip LDi onto the top surface of the base plate.

SUMMARY

A light-guiding device according to the present embodiment is a light-guiding device that converts an input beam bundle made of a plurality of input beams to an output beam bundle made of a plurality of output beams, including: double mirrors which (i) correspond to the respective input beams and (ii) are separated from each other, each of the double mirrors being made of a first mirror that is mounted on a certain flat surface and a second mirror that is mounted on the first mirror, the first mirror having a first reflective surface which (i) reflects a corresponding one of the input beams and (ii) is arranged so that there is an angle of θ1 between the certain flat surface and the first reflective surface, the second mirror having a second reflective surface which (i) reflects the corresponding one of the input beams which has been reflected by the first reflective surface and (ii) is arranged so that there is an angle of θ2 between the certain flat surface and the second reflective surface, the θ1 satisfying the following expression: $(90°-θ_{angle})=-θ2y=-(90°-φ1)×2-(90°-θ1×2)$, and the θ2 satisfying the following expression: $(90°-φ2)=-θ1y×2-(90°-θ2×2)$, where (i) $θ_{angle}$ is an angle between the corresponding one of the input beams and a corresponding one of the output beams, (ii) φ1 is an angle between an optical axis of the corresponding one of the input beams and a normal of the certain flat surface, (iii) φ2 is an angle between an optical axis of the corresponding one of the output beams and the normal of the certain flat surface, (iv) θ1y is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the input beams onto the certain flat surface, and (v) θ2y is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the input beams onto the certain flat surface.

In the above configuration, the first reflective surface for reflecting a corresponding one of the input beams is provided to the first mirror mounted on the certain flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror. In so doing, (i) it is not necessary that a light source or the like for emitting the input beam is provided so that the optical axis of the input beam is parallel to the certain flat surface or (ii) it is not necessary that an optical fiber or the like for receiving the output beam is provided so that the optical axis of the output beam is parallel to the certain flat surface.

Moreover, in the above configuration, the double mirrors correspond to the respective input beams. Further, these double mirrors are separated from each other. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

In the light-guiding device according to the present embodiment, preferably, in each of the double mirrors, respective orientations of the first mirror and the second mirror are adjusted so that propagation directions of the output beams constituting the output beam bundle coincide with a certain direction.

The above configuration makes it possible to obtain an output beam bundle that can be converged precisely through a convex lens or the like.

In the light-guiding device according to the present embodiment, preferably, in each of the double mirrors, respective positions of the first mirror and the second mirror are adjusted so that optical axes of the output beams constituting the output beam bundle are aligned at equal intervals within a certain plane.

The above configuration makes it possible to obtain an output beam bundle that can be converged more precisely.

In the light-guiding device according to the present embodiment, preferably, the certain flat surface and a bottom surface of the first mirror are adhered to each other via an adhesive layer formed between the certain flat surface and the bottom surface, the adhesive layer having a uniform thickness; and a top surface of the first mirror and a bottom surface of the second mirror are adhered to each other via an adhesive layer formed between the top surface of the first mirror and the bottom surface of the second mirror, the adhesive layer having a uniform thickness.

According to the above configuration, even in a case where an adhesive layer formed between the certain flat surface and the bottom surface of the first mirror expands or shrinks, an amount of expansion or shrinkage becomes equal at any position. Accordingly, even in a case where the adhesive layer expands or shrinks, only parallel shift of the first mirror occurs in a direction that is orthogonal to the top surface of the certain flat surface (a thickness direction of the adhesive layer), and the top surface of the certain flat surface and the bottom surface of the first mirror stay parallel to each other. Similarly, even in a case where an adhesive layer formed between the top surface of the first mirror and the bottom surface of the second mirror expands or shrinks, only parallel shift of the second mirror occurs in a direction that is orthogonal to the top surface of the first mirror, and the top surface of the first mirror and the bottom surface of the second mirror stay parallel to each other. Accordingly, if the thickness of each of these adhesive layers is uniform, it is possible to avoid the occurrence of, for example, a case where a propagation direction of an output beam inclines or a case where alignment of the optical axes of the output beams is lost even in a case where the adhesive layers shrink or expand. Note that possible shrinkage or expansion of these adhesive layers are cure shrinkage that may occur when the adhesive is cured, a thermal expansion that may occur after the adhesive is cured, a thermal shrinkage, swelling, or the like.

In the light-guiding device according to the present embodiment, preferably, a thickness of an adhesive layer formed between the certain flat surface and a bottom surface of the first mirror and a thickness of an adhesive layer formed between a top surface of the first mirror and a bottom surface of the second mirror each are smaller than a dimensional tolerance of each of the double mirrors.

A smaller thickness of each of the thickness of the adhesive layer formed between the certain flat surface and the bottom surface of the first mirror and a smaller thickness of the adhesive layer formed between the top surface of the first mirror and the bottom surface of the second mirror results in a smaller amount of change in thickness that occurs in a case where each of these adhesive layers expands or shrinks. This consequently makes it easily to keep the certain flat surface and the bottom surface of the first mirror parallel to each other and also keep the top surface of the first mirror and the bottom surface of the second mirror parallel to each other. Therefore, according to the above configuration, even in a case where these adhesive layers expand or shrink, a degree of parallelism of the certain flat surface and the bottom surface of the first mirror and a degree of parallelism of the top surface of the first mirror and the bottom surface of the second mirror never become lower than a degree accepted in designing regardless of whether or not the thicknesses of the adhesive layers are uniform.

A production method according to the present embodiment is a method for producing the light-guiding device, including the step of: adjusting respective orientations of the first mirror and the second mirror of each of the double mirrors so that propagation directions of the output beams constituting the output beam bundle coincide with a certain direction.

The above configuration makes it possible to obtain an output beam bundle that can be converged precisely through a convex lens or the like.

The production method according to the present embodiment preferably includes the step of: adjusting respective positions of the first mirror and the second mirror of each of the double mirrors so that respective optical axes of the output beams are aligned at equal intervals within a certain plane.

The above configuration makes it possible to obtain an output beam bundle that can be converged more precisely.

An LD module according to the present embodiment is an LD module including: a plurality of LD elements; and a light-guiding device that converts an input beam bundle made of a plurality of laser beams that have respectively been emitted from the plurality of LD elements, to an output beam bundle made of a plurality of output beams, the light guiding device including double mirrors which (i) correspond to the respective LD elements and (ii) are separated from each other, each of the double mirrors being made of a first mirror that is mounted on a certain flat surface and a second mirror that is mounted on the first mirror, the first mirror having a first reflective surface which (i) reflects a corresponding one of the laser beams which has been emitted from a corresponding one of the LD elements and (ii) is arranged so that there is an angle of $\theta 1$ between the certain flat surface and the first reflective surface, the second mirror having a second reflective surface which (i) reflects the corresponding one of the laser beams which has been reflected by the first reflective surface and (ii) is arranged so that there is an angle of $\theta 2$ between the certain flat surface and the second reflective surface, the $\theta 1$ satisfying the following expression: $(90°-\theta_{angle})=-\theta 2y=-(90°-\varphi 1)\times 2-(90°-\theta 1\times 2)$, and the $\theta 2$ satisfying the following expression: $(90°-\varphi 2)=-\theta 1y\times 2-(90°-\theta 2\times 2)$, where (i) $\theta_{angle}$ is an angle between the corresponding one of the laser beams and a corresponding one of the output beams, (ii) $\varphi 1$ is an angle between an optical axis of the corresponding one of the laser beams and a normal of the certain flat surface, (iii) $\varphi 2$ is an angle between an optical axis of the corresponding one of the output beams and the normal of the certain flat surface, (iv) $\theta 1y$ is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the laser beams onto the certain flat surface, and (v) $\theta 2y$ is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the laser beams onto the certain flat surface.

By including the light-guiding device, it becomes possible to provide an LD module capable of realizing a higher output and a higher efficiency.

The LD module according to the present embodiment preferably configured to further include a converging lens that converges the output beam bundle on an incident edge surface of an optical fiber, wherein in each of the double mirrors, respective orientations of the first mirror and the second mirror are adjusted so that propagation directions of the output beams constituting the output beam bundle coincide with a certain direction, wherein in each of the double mirrors, respective positions of the first mirror and the second mirror are adjusted so that optical axes of the output beams constituting the output beam bundle are aligned at equal intervals within a certain plane.

The above configuration makes it possible to generate an output beam bundle that can be converged precisely.

The present specification also discloses the following invention.

That is, a light-guiding device according to the present embodiment is a light-guiding device that converts an input beam bundle made of a plurality of input beams to an output beam bundle made of a plurality of output beams, including: double mirrors which correspond to the respective input beams and (ii) are separated from each other, each of the double mirrors being made of a first mirror that is mounted on a certain flat surface and a second mirror that is mounted on the first mirror, the first mirror having a first reflective surface whose normal makes an angle of 45° with a normal of the certain flat surface, the first reflective surface reflecting a corresponding one of the input beams, the second mirror having a second reflective surface whose normal makes an angle of 135° with the normal of the certain flat surface, the second reflective surface reflecting the corresponding one of the input beams which has been reflected by the first reflective surface.

In the above configuration, the first reflective surface for reflecting a corresponding one of the input beams is provided to the first mirror mounted on the certain flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror.

Moreover, in the above configuration, the double mirrors each correspond to a corresponding one of the input beams. Further, these double mirrors are separated from each other. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

The scope of the present embodiment encompasses a method for producing the light-guiding device.

Further, it becomes possible to produce a light-guiding device generating an output beam bundle that can be converged precisely, by further including the step of adjusting respective orientations of the first mirror and the second mirror of each of the double mirrors so that propagation directions of the output beams constituting the output beam bundle coincide with a certain direction, or by further including the step of adjusting respective positions of the first mirror and the second mirror of each of the double mirrors so that respective optical axes of the output beams are aligned at equal intervals within a certain plane, in addition to the step of adjusting respective orientations of the first mirror and the second mirror.

The scope of the present embodiment also encompasses an LD module including the light-guiding device.

By including the light-guiding device, it becomes possible to provide an LD module capable of realizing a higher output and a higher efficiency.

[Additional Matters]

The present invention is not limited to the description of the embodiments above, but may be altered as appropriate by a skilled person within the scope of the claims. That is, the present invention encompasses an embodiment based on a proper combination of technical means modified as appropriate within the scope of the claims.

INDUSTRIAL APPLICABILITY

The present invention can be suitably applied to an LD module, and in particular, to an LD module that has an LD chip(s) as a light source.

REFERENCE SIGNS LIST

1 LD module
LD1 to LD10 LD chip
FAC1 to FAC10 F-axis collimating lens
SAC1 to SAC10 S-axis collimating lens
M1 to M10 Double mirror
Mi1 First mirror
S1 Reflective surface (first reflective surface)
Mi2 Second mirror
S2 Reflective surface (second reflective surface)
B Base plate
FL F-axis light collecting lens
SL S-axis light collecting lens

The invention claimed is:

1. A light-guiding device that converts an input beam bundle made of a plurality of input beams to an output beam bundle made of a plurality of output beams, comprising:

double mirrors which (i) correspond to the respective input beams and (ii) are separated from each other, each of the double mirrors being made of a first mirror that is mounted on a certain flat surface and a second mirror that is mounted on the first mirror, the first mirror having a first reflective surface which (i) reflects a corresponding one of the input beams and (ii) is arranged so that there is an angle of $\theta1$ between the certain flat surface and the first reflective surface, the second mirror having a second reflective surface which (i) reflects the corresponding one of the input beams which has been reflected by the first reflective surface and (ii) is arranged so that there is an angle of $\theta2$ between the certain flat surface and the second reflective surface, the $\theta1$ satisfying the following expressions:

$$(90°-\theta_{angle})=-\theta2y\times2-(90°-\varphi1)\times2-(90°-\theta1\times2);\text{ and}$$

$$\theta1\neq45°,\text{ and}$$

the $\theta2$ satisfying the following expressions:

$$(90°-\varphi2)-\theta1y\times2-(90°-\theta2\times2);\text{ and}$$

$$\theta2\neq45°,$$

where (i) $\theta_{angle}$ is an angle between the corresponding one of the input beams and a corresponding one of the output beams, (ii) $\varphi1$ is an angle between an optical axis of the corresponding one of the input beams and a normal of the certain flat surface, (iii) $\varphi2$ is an angle between an optical axis of the corresponding one of the output beams and the normal of the certain flat surface, (iv) $\theta1y$ is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the input beams onto the certain flat surface, and (v) $\theta2y$ is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the input beams onto the certain flat surface.

2. The light-guiding device as set forth in claim 1, wherein:

in each of the double mirrors, respective orientations of the first mirror and the second mirror are adjusted so that propagation directions of the output beams constituting the output beam bundle coincide with a certain direction.

3. The light-guiding device as set forth in claim 2, wherein:
in each of the double mirrors, respective positions of the first mirror and the second mirror are adjusted so that optical axes of the output beams constituting the output beam bundle are aligned at equal intervals within a certain plane.

4. The light-guiding device as set forth in claim 1, wherein:
the certain flat surface and a bottom surface of the first mirror are adhered to each other via an adhesive layer formed between the certain flat surface and the bottom surface, the adhesive layer having a uniform thickness; and
a top surface of the first mirror and a bottom surface of the second mirror are adhered to each other via an adhesive layer formed between the top surface of the first mirror and the bottom surface of the second mirror, the adhesive layer having a uniform thickness.

5. The light-guiding device as set forth in claim 1, wherein:
a thickness of an adhesive layer formed between the certain flat surface and a bottom surface of the first mirror and a thickness of an adhesive layer formed between a top surface of the first mirror and a bottom surface of the second mirror each are smaller than a dimensional tolerance of each of the double mirrors.

6. A method for producing the light-guiding device as set forth in claim 1, comprising the step of:
adjusting respective orientations of the first mirror and the second mirror of each of the double mirrors so that propagation directions of the output beams constituting the output beam bundle coincide with a certain direction.

7. The method as set forth in claim 6, further comprising the step of:
adjusting respective positions of the first mirror and the second mirror of each of the double mirrors so that respective optical axes of the output beams are aligned at equal intervals within a certain plane.

8. An LD module comprising:
a plurality of LD elements; and
a light-guiding device that converts an input beam bundle made of a plurality of laser beams that have respectively been emitted from the plurality of LD elements, to an output beam bundle made of a plurality of output beams,
the light guiding device including double mirrors which (i) correspond to the respective LD elements and (ii) are separated from each other,
each of the double mirrors being made of a first mirror that is mounted on a certain flat surface and a second mirror that is mounted on the first mirror,
the first mirror having a first reflective surface which (i) reflects a corresponding one of the laser beams which has been emitted from a corresponding one of the LD elements and (ii) is arranged so that there is an angle of θ1 between the certain flat surface and the first reflective surface,
the second mirror having a second reflective surface which (i) reflects the corresponding one of the laser beams which has been reflected by the first reflective surface and (ii) is arranged so that there is an angle of θ2 between the certain flat surface and the second reflective surface,
the θ1 satisfying the following expressions:

$$(90°-\theta_{angle})=-\theta 2y\times 2-(90°-\varphi 1)\times 2-(90°-\theta 1x2); \text{ and}$$

$$\theta 1\neq 45°, \text{ and}$$

the θ2 satisfying the following expressions:

$$(90°-\varphi 2)-\theta 1y\times 2-(90°-\theta 2x2); \text{ and}$$

$$\theta 2\neq 45°,$$

where (i) $\theta_{angle}$ is an angle between the corresponding one of the laser beams and a corresponding one of the output beams, (ii) $\varphi 1$ is an angle between an optical axis of the corresponding one of the laser beams and a normal of the certain flat surface, (iii) $\varphi 2$ is an angle between an optical axis of the corresponding one of the output beams and the normal of the certain flat surface, (iv) $\theta 1y$ is a rotation angle which shows how much the first mirror has rotated from a first reference direction around the normal of the certain flat surface serving as a rotation axis, which first reference direction is a direction of the first mirror while an orthogonal projection of a normal vector of the first reflective surface onto the certain flat surface is parallel to an orthogonal projection of the optical axis of the corresponding one of the laser beams onto the certain flat surface, and (v) $\theta 2y$ is a rotation angle which shows how much the second mirror has rotated from a second reference direction around the normal of the certain flat surface serving as a rotation axis, which second reference direction is a direction of the second mirror while an orthogonal projection of a normal vector of the second reflective surface onto the certain flat surface is orthogonal to the orthogonal projection of the optical axis of the corresponding one of the laser beams onto the certain flat surface.

9. The LD module as set form in claim 8, further comprising:
a converging lens that converges the output beam bundle on an incident edge surface of an optical fiber,
wherein in each of the double mirrors, respective orientations of the first mirror and the second mirror are adjusted so that propagation directions of the output beams constituting the output beam bundle coincide with a certain direction,
wherein in each of the double mirrors, respective positions of the first mirror and the second mirror are adjusted so that optical axes of the output beams constituting the output beam bundle are aligned at equal intervals within a certain plane.

* * * * *